United States Patent
Sasaki et al.

(10) Patent No.: US 6,721,930 B2
(45) Date of Patent: Apr. 13, 2004

(54) ELECTRONIC CIRCUIT DEVICE AND ITS DESIGN METHOD

(75) Inventors: Yasuhiko Sasaki, Koganei (JP); Naoki Kato, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 51 days.

(21) Appl. No.: 09/922,747

(22) Filed: Aug. 7, 2001

(65) Prior Publication Data

US 2002/0104064 A1 Aug. 1, 2002

(30) Foreign Application Priority Data

Jan. 29, 2001 (JP) ........................................ 2001-019566

(51) Int. Cl.$^7$ ............................................. G06F 17/50
(52) U.S. Cl. .................................. 716/6; 716/5; 716/4
(58) Field of Search ................ 716/6, 5, 4, 1, 716/10, 12

(56) References Cited

U.S. PATENT DOCUMENTS

| | | | |
|---|---|---|---|
| 5,619,420 A | * 4/1997 | Breid .............................. | 716/8 |
| 5,983,006 A | * 11/1999 | Carlson et al. ................. | 716/4 |
| 6,453,446 B1 | * 9/2002 | van Ginneken ................. | 716/3 |
| 6,467,069 B2 | * 10/2002 | Mehrotra et al. ............... | 716/6 |

FOREIGN PATENT DOCUMENTS

| | | |
|---|---|---|
| JP | 11-40677 | 7/1997 |

OTHER PUBLICATIONS

Yasuhiko Sasaki and Giovanni De Micheli, "Crosstalk Delay Analysis Using Relative Window Method," Proceedings of IEEE International ASIC/SOC Conference 1999, pp. 9–13.

Yasuhiko Sasaki and Kazuo Yano, "Multi–Aggressor Relative Window Method for Timing Analysis Including Crosstalk Delay Degradation," Proceedings of IEEE Custom Integrated Circuits Conference 2000, pp. 495–498.

* cited by examiner

Primary Examiner—Vuthe Siek
Assistant Examiner—Brandon Bowers
(74) Attorney, Agent, or Firm—Reed Smith LLP; Stanley P. Fisher, Esq.; Juan Carlos A. Marquez, Esq.

(57) ABSTRACT

A method for designing an electronic logic circuit device for reducing delay time degradation due to crosstalk between a wire in question and a wire adjacent thereto and for preventing the increase of designing work in case signal arrival time of each of the wire in question and the adjacent wire is dynamically changed according to the input pattern. Delay time degradations is calculated from range of relative signal arrival time (relative window) of the wire in question and the adjacent wire, and when there is violation of design constraint, delay time degradation is reduced by preventing the relative window from touching a curve of delay time degradation.

10 Claims, 21 Drawing Sheets

| VSAT \ ASAT | −0.5 | −0.2 | 0 | 0.2 |
|---|---|---|---|---|
| 0 | 0.02 | 0.08 | 0.13 | 0.08 |
| 0.2 | 0.00 | 0.03 | 0.08 | 0.13 |
| 0.4 | 0.00 | 0.01 | 0.03 | 0.08 |
| 0.5 | 0.00 | 0.00 | 0.00 | 0.03 |

VSAT : VICTIM SIGNAL ARRIVAL TIME
ASAT : AGGRESSOR SIGNAL ARRIVAL TIME

| SIGNAL PATH | SIGNAL ARRIVAL TIME AT NODE n2 |
|---|---|
| in1->n1->n2 | 0.25ns+0.15ns=0.40ns |
| in2->n1->n2 | 0.20ns+0.15ns=0.35ns |
| in3->n2 | 0.10ns |

①Min(RSAT)=Min(ASAT)−Max(VSAT)
②Max(RSAT)=Max(ASAT)−Min(VSAT)

FIG. 5

| | SIGNAL ARRIVAL TIME WINDOWS OF ADJACENT WIRES | RELATIONSHIP BETWEEN RELATIVE WINDOW AND DELAY DEGRADATION |
|---|---|---|
| BEFORE REDUCTION OF CROSSTALK DELAY | 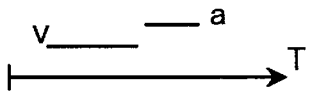 | 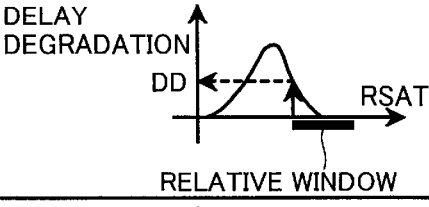 |
| AFTER REDUCTION OF CROSSTALK DELAY | 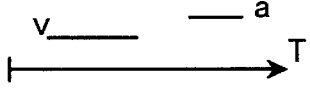 | 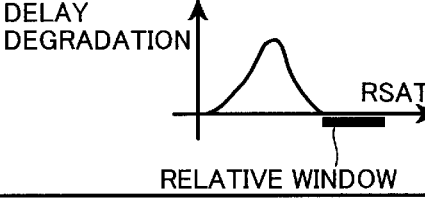 |

FIG. 6

| | SIGNAL ARRIVAL TIME WINDOWS OF ADJACENT WIRES | RELATIONSHIP BETWEEN RELATIVE WINDOW AND DELAY DEGRADATION |
|---|---|---|
| BEFORE REDUCTION OF CROSSTALK DELAY | 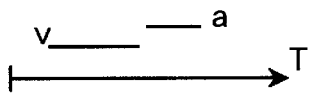 | 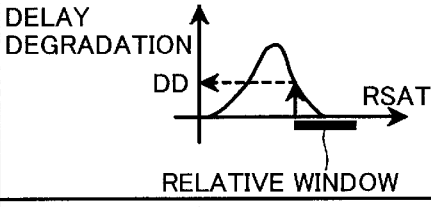 |
| AFTER REDUCTION OF CROSSTALK DELAY |  | 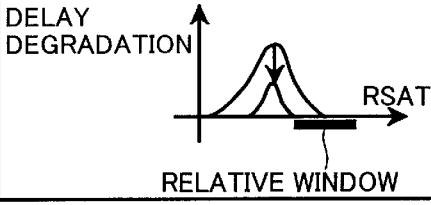 |

FIG. 7
|  | SIGNAL ARRIVAL TIME WINDOWS OF ADJACENT WIRES | RELATIONSHIP BETWEEN RELATIVE WINDOW AND DELAY DEGRADATION |
|---|---|---|
| BEFORE REDUCTION OF CROSSTALK DELAY | 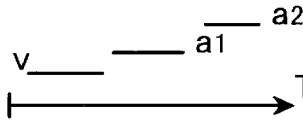 | 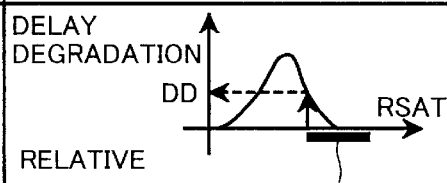 |
| AFTER REDUCTION OF CROSSTALK DELAY | 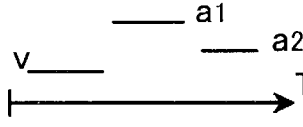 | 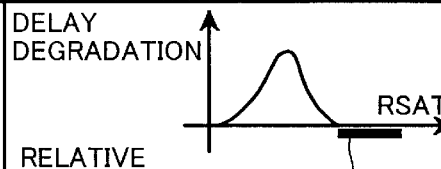 |

FIG. 8A
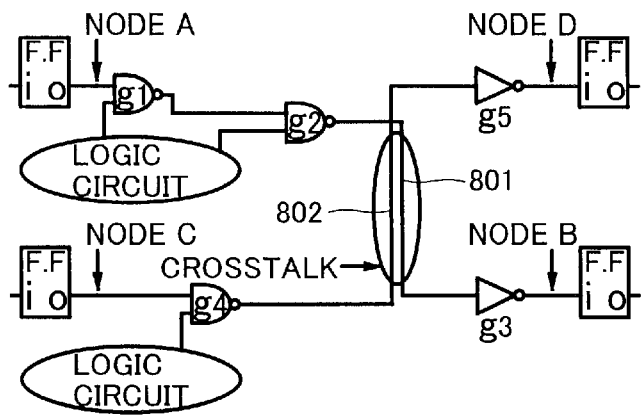
FIG. 8B
FIG. 8C
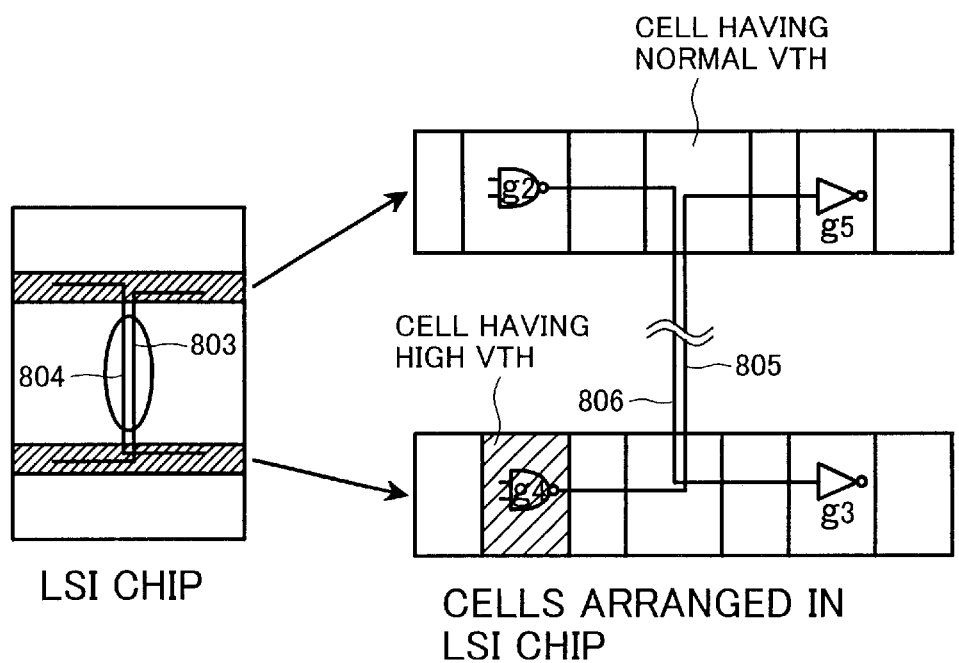

CELLS ARRANGED IN
LSI CHIP

WIRE TRACK

WIRE TRACK

LSI CHIP

WIRE TRACK

SIGNAL ARRIVAL TIME WINDOW OF EACH NET

SIGNAL ARRIVAL TIME WINDOW OF EACH NET

SIGNAL ARRIVAL TIME WINDOW OF EACH NET

WIRE TRACK

WIRE TRACK

ELECTRONIC CIRCUIT DEVICE AND ITS DESIGN METHOD

BACKGROUND OF THE INVENTION

1. Field of the Invention

The present invention relates to the reduction of crosstalk in an electronic circuit device or system such as semiconductor integrated circuit (LSI), circuit mounted in a package, and an electronic circuit device mounted on a printed circuit board. In particular, the present invention relates to the application in electronic logic circuit system such as general-purpose processor, signal processor, ASIC, gate array, FPGA, image processor, semiconductor memory, system module, memory module, computer system, portable device system, etc.

2. Description of the Related Art

In the past, a logic circuit has been manufactured as follows: A large or a small circuit having a certain logic functions and called a cell or a block is disposed in a package or on a semiconductor integrated circuit chip or on a printed circuit board. Then, input/output terminals of each cell or circuit block are connected using metal wires. If the semiconductor integrated circuit chip (the components such as ASIC, gate array, FPGA, etc.), package module, or system on substrate can be fabricated within small area, it would be advantageous from economical viewpoint. Therefore, it is desirable that integration density or mounting density of cells, blocks and wires can be made as high as possible.

For this reason, in the field of semiconductor integrated circuit, fabrication technique has been increasingly miniaturized. The mounting technique in package or on substrate has been turned to higher density. However, when it is tried to accommodate a great number of elements and wires within a small region, various problems arise. One of these problems is the problem of crosstalk.

Crosstalk means interference of signals, which may occur between wires when a plurality of wires are arranged at positions physically closer to each other. In general, the functions to be processed by circuit are designed in such manner that the processing can be completed within a given delay time and integrated circuit and system can be operated at a desired frequency. In this case, if design is performed without taking the crosstalk into account, the change of delay time caused under the influence of signal interference is often overlooked. Under such circumstances, semiconductor integrated circuit chip or system may not be operated at the desired frequency.

If semiconductor integrated circuit chip or system is not operated at the desired frequency, the chip or the system must be re-designed, and this means a great loss of cost and time. To avoid such situation, it is necessary to avoid or reduce the problem of delay time degradation due to crosstalk after accurately analyzing degradation of delay time due to crosstalk.

The difficulty in the problem of delay time degradation due to crosstalk is the fact that its influence changes depending on signal arrival time. This is described in the article presented by the present inventors: "Crosstalk Delay Analysis using Relative Window Method"; Proceedings of IEEE International ASIC/SOC Conference 1999, pp. 9–13 (hereinafter referred as the reference 1).

Specifically, delay time is subject to diverse changes (degradation) depending upon the timing of signal arrival time (victim signal arrival time; VSAT) on the wire, for which analysis of delay time is to be performed (hereinafter referred as "the wire in question" or "victim") and signal arrival time (aggressor signal arrival time; ASAT) on the wire, which interferes the above wire (hereinafter referred as "the adjacent wire" or "aggressor") (Hereinafter, the value of this change is referred as "delay time degradation value"). FIG. 1 is used to explain an example of delay degradation, which depends upon a combination of signal arrival time of victim and aggressor. A circuit diagram is shown on left side, and a delay degradation characteristic table corresponding to the circuit is given on right side.

In the cited reference 1, relative signal arrival time (RSAT), which is obtained by relatively measuring ASAT using VSAT as a reference, is used to address this problem. In this case, as in FIG. 2, which shows the change of delay degradation value due to relative signal arrival time (RSAT), the delay time degradation values are represented on a graph or a table with the relative signal arrival time on axis of abscissa. This is prepared in advance for a combination of drivers, which drive victim and aggressor. For each actual case, this graph or the table is drawn, and delay time degradation values are calculated.

Further, another difficulty relating to this problem lies in that VSAT or ASAT themselves may change according to the input patterns. FIG. 3 shows this fact. An example of circuit diagram is shown on left side, and a characteristic table is given on right side based on the measurement of the changes of signal arrival time depending on the input patterns (signal paths) to correspond to the circuit. For instance, in case there is a change in a given input pattern, signal is transmitted from in1 to n2 via n1. In this case, the signal arrival time at the node n2 is 0.40 ns. However, in another input pattern change, signal is transmitted from in3 to n2, and signal arrival time at the node n2 is 0.10 ns, and this is different from the above value. For this reason, it is not possible to uniquely determine RSAT, and the degradation table of FIG. 2 cannot be applied in simple manner.

In the reference 1, this problem is addressed by utilizing a concept called "relative window". FIGS. 4A to 4C show this method. VSAT and ASAT are changed according to the input pattern, and these cannot be obtained as a time at a certain node. Therefore, VSAT or ASAT is calculated as a window with a certain width (FIG. 4A: VSAT and ASAT window calculation). Next, RSAT cannot be uniquely determined, and it is calculated as a window having a width (hereinafter referred as "relative window") (FIG. 4B: relative window calculation). Here, the relative window is a range from the time when RSAT is at minimum to the time when it is at maximum. The time when RSAT is at minimum is the time when ASAT is at minimum and VSAT is at maximum. On the other hand, the time when RSAT is at maximum is the time when ASAT is at maximum and VSAT is at minimum. Finally, the worst value is obtained in the range of the relative window using the relative window and the degradation table already prepared, and the quantitatively determined delay time degradation value can be obtained (FIG. 4C: acquisition of delay degradation value).

A more detailed analysis method in case there are a plurality of adjacent wires is described by the present inventors in: "Multi-aggressor Relative Window Method"; Proceedings of IEEE Custom Integrated Circuits Conference 2000, pp. 495–498 (hereinafter referred as the reference 2).

In the meantime, with the purpose of avoiding and reducing delay time degradation due to crosstalk, it is necessary to achieve such reduction by accurately calculating and evaluating the influence of the signal arrival time as described above. The reference 1 gives an example. Delay gate is inserted to a bus, where the signal arrives earlier when the signal arrival time at the gate output for driving the wire in question has a greater width, and signal arrival time for each bus is equalized. The signal arrival time at the wire in question is narrowed down and is separated from the signal arrival time of the adjacent wire in order to reduce crosstalk. In another example, when signal arrival time of two wires located on adjacent tracks is closer to each other, one of the wires is replaced with the wire on the other track, and signal arrival time is separated in order to reduce crosstalk. JP-A-11-40677 (hereinafter referred as the reference 3) describes a method to insert delay gate and to eliminate crosstalk error when there is timing overlap in signal arrival time.

As described above, when a circuit is realized within narrow space, wires are arranged at positions closer to each other, and there arises a problem that delay time is degraded due to crosstalk. Delay time degradation due to crosstalk does not necessarily occur at all times, and it occurs when the wire in question is changed at a timing closer to the adjacent wire in terms of time. However, signal arrival time of each of the wire in question and the adjacent wire is dynamically changed in response to the change of the input pattern. By taking this into account, it is desirable to accurately analyze delay time degradation due to crosstalk and to address this problem only when the problem arises.

The designing of LSI can be generally carried out by dividing steps such as logic synthesis, arrangement, and wiring. Specifically, a designer first uses the so-called logic synthesis tool on a logic circuit described in design language and generates an information as to what gate is logically connected and how (the so-called net list). Next, physical position of the gate used is determined (arranged).

Finally, the arranged gates are connected with each other, i.e. wiring is performed. Here, with the purpose of solving the problem of delay time degradation due to crosstalk, an example to insert a delay gate is shown as a method described in the references 1 or 3. In this way, to insert the delay gate means that change occurs in the logic gate used in the circuit. Therefore, among the above three steps, change occurs in the step of logic synthesis. Thus, in association with this, it is necessary to carry out the step of arrangement and the step of wiring again. This re-designing leads to the increase of the work for designing LSI (working period and number of working processes), and this causes serious problem.

In summing up, when it is tried to reduce delay time degradation due to crosstalk based on the fact that signal arrival time of each of the wire in question and the adjacent wire is dynamically changed in response to the changes of the input pattern, it is important to carry out re-designing with less time and labor.

Further, the method as described in the reference 3 is a method to reduce crosstalk when there is timing overlap in the signal arrival time. In this sense, when there is no timing overlap (except the case where the relative signal arrival time is 0 as shown in FIG. 2), delay time degradation due to crosstalk cannot be reduced.

It is an object of the present invention to provide an electronic circuit device with reduced crosstalk and a method for designing such a device.

It is another object of the present invention to provide a method for efficiently designing an electronic circuit system on high-performance integrated circuit or on printed circuit board, with less delay time degradation due to crosstalk even in case where signal arrival time of each of the wire in question and the adjacent wire is dynamically changed according to the input signal pattern.

It is still another object of the present invention to provide a method for designing an electronic logic circuit device in order to the reduce delay time degradation due to crosstalk between the wire in question and the adjacent wire by minimizing the increase of the designing work in case where signal arrival time of each of the wire in question and the adjacent wire is dynamically changed according to the input signal pattern.

SUMMARY OF THE INVENTION

The present invention provides a method for designing an electronic circuit device without increasing the designing work in case delay time degradation due to crosstalk is reduced according to the fact that signal arrival time of each of the wire in question and the adjacent wire is dynamically changed in response to the change of the input pattern. For this purpose, according to the present invention, the range of relative signal arrival time (relative window in the reference 1) on the wires adjacent to each other (victim and aggressor) is calculated. Then, delay degradation amount is calculated according to the positional relationship, and if the degradation amount does not meet the design constraint and causes a problem, the degradation amount is reduced.

The principle of the reduction of crosstalk common to all features of the present invention is based on the method as shown in FIG. 5 to FIG. 7. FIG. 5 to FIG. 7 each represents how the degradation is reduced using a graph of delay time degradation value with relative signal arrival time RSAT represented on axis of abscissa.

In FIG. 5, in the case before the action is taken (upper portion in the table), the relative window in delay time degradation curve touches a portion, which is not 0, and degradation occurs (DD in the figure). In contrast, when signal arrival time window of aggressor is delayed by a certain means (lower portion of the table), relative window in the delay time degradation curve does not touch a portion, which is not 0, and the delay time degradation value is turned to 0.

Next, in FIG. 6, in the case before the action is taken (upper portion of the table), the relative window in the delay time degradation curve touches a portion, which is not 0, and degradation occurs (DD in the figure). In contrast, if the delay time degradation curve is reduced in size using a certain means (lower portion of the table), the relative window in the delay time degradation curve does not touch a portion, which is not 0, and the delay time degradation value is turned to 0.

Further, in FIG. 7, in the case before the action is taken (upper portion of the table), the relative window in the delay time degradation curve touches a portion, which is not 0, and degradation occurs (DD in the figure). In contrast, if the aggressor can be replaced with the one different from the case before the action is taken using a certain means (i.e. the one adjacent to v is changed from a1 to a2) (lower portion of the table), the relative window is changed, and it does not touch a portion, which is not 0, in the delay time degradation curve, and the delay time degradation value is turned to 0.

In each of the examples shown in FIG. 5 to FIG. 7, description has been given on the case where delay time degradation value is completely turned to 0 by the action taken. However, it is needless to say that, if the reduction meets the design constraint, it will suffice even when the delay time degradation value is not completely turned to 0.

With the purpose of reducing delay time degradation as described above without increasing the designing work, this is accomplished by using a logic gate comprising a transistor with different threshold voltage (the so-called Vth).

This is shown in FIGS. 8A to 8C. First, in FIG. 8A, it is supposed that a certain design constraint relating to delay time is applied on a path from a node A to a node B and on a path from a node C to a node D. In the figure, a wire 801 is adjacent to a wire 802, and crosstalk occurs on this portion. In case delay time is calculated on the assumption that there is no crosstalk, even if design constraint is met on the path from the node A to the node B, violation of the design constraint takes place on this portion because there is degradation of delay time due to crosstalk. Regarding to the path from the node C to the node D, it is assumed that there is some flexibility in the design constraint of the delay time. FIG. 8B and FIG. 8C each represents a situation where the circuit of FIG. 8A is physically arranged on the chip and is connected. These are schematical plan views of an LSI chip and cells arranged in the chip respectively as seen from above the chip. That is, FIG. 8B shows an image of the chip, and FIG. 8C represents cells in the chip. In FIG. 8A, wires 801 and 802 where crosstalk occurs correspond to 803 and 804 in FIG. 8B and to 805 and 806 in FIG. 8C. It is now tried to reduce the crosstalk in accordance with the principle shown in FIG. 5 using gates with different threshold values (the so-called Vth). It is assumed that the window of signal arrival time of the wire 805 corresponds to "a" (aggressor) in FIG. 5, and that the window of signal arrival time of the wire 806 corresponds to "v" (victim) in FIG. 5. A logic gate g4 is a gate to drive the aggressor "a" in FIG. 5, and this gate is designed with a transistor having threshold value higher than the threshold value as initially in use. Normally, a logic gate comprising a transistor having higher threshold value has longer delay time than a logic gate comprising a transistor having lower threshold value. Therefore, the signal arrival time at the aggressor "a" is delayed. As a result, the relationship between the relative window and the delay degradation amount is changed as shown in FIG. 5, and the problem is solved. The transistors with different threshold values can be achieved by changing ion injection amount using a mask or by changing potential on the semiconductor substrate on this portion. In any of these cases, it is possible to change the threshold value with respect to the designed data as achieved through the steps of logic synthesis, arrangement and wiring, and there is no need to repeat the steps of logic synthesis, arrangement and wiring. As a result, it is possible to reduce the crosstalk without increasing the designing work.

Further, according to the present invention, delay time degradation can be reduced by combining wires with different vertical/lateral connecting ratio in either of capacitance or inductance of the wires. This is shown in FIGS. 9A to 9D. FIG. 9A represents a circuit diagram similar to that of FIG. 8A, and it is also assumed that the conditions such as design constraint relating to delay time are the same. A wire 901 and a wire 902 where crosstalk occurs are turned to a wire 903 and a wire 904 in FIG. 9B with logic gates connected with each other on the cells similarly to FIG. 8C. FIG. 9C shows an enlarged view of these wires, and the wires 903 and 904 correspond to wires 905 and 906 respectively. FIGS. 9B and 9C each represents a schematical plan view of cells and wire tracks arranged on the chip as seen from above the chip. Normally, when wiring is performed using a design tool, it is laid out in such manner that wires are placed on wire tracks disposed with a certain width and spacing. Therefore, the wires 905 and 906 are shown as wires with the same width on adjacent track in the figure. Here, it is assumed that the window of signal arrival time of the wire 905 corresponds to "v" in FIG. 6 and the window of signal arrival time of the wire 906 corresponds to "a" in FIG. 6. In case wire tracks with wires with different widths are provided partially, it is possible to reduce delay time degradation due to crosstalk. This is shown in FIG. 9D. Here, it is assumed that, in the step of wiring at first, the wires 901 and 902 in FIG. 9A are arranged on the wire track of the same width adjacent to each other as shown by the wires 907 and 908. In this step, delay time analysis using relative window is performed, and it is found that these wires cause delay time degradation due to crosstalk and this violates the design constraint. In such case, if the wire 901 is laid out using a wire 909 on a wire track with wider width (instead of the wire 907), it is possible to reduce the crosstalk. This is because, if the victim can be achieved using a wire with wider width, the capacitance of the wire itself is high, and this leads to higher connecting ratio in either of capacitance in vertical direction (i.e. a direction toward depth in a laminated wire layer), and the connecting ratio of capacitance in lateral direction with respect to the adjacent wire is decreased. As a result, the delay time degradation curve in FIG. 6 can be reduced in size. In this case, too, there is no need to change the arrangement of logic gates as in the case where threshold value is changed, and this means that designing work is not increased. The wiring is to be changed, and this can be accomplished by changing from FIG. 10A to FIG. 10B in the plan view of the wire pattern. Therefore, the problem can be addressed by mere local change, i.e. the change of connecting point of vertical wire and lateral wire in the figure without changing the wire track of lateral wire. For this reason, there is less influence on the other wires, and this also contributes to the prevention of the increase of designing work.

Further, according to the present invention, wiring is carried out with due consideration on the characteristics of window of signal arrival time, and this makes it possible to reduce delay time degradation. This is shown in FIGS. 11A to 11D. In the design steps such as logic synthesis, arrangement and wiring, if arrangement is made without taking adjacent relationship of victim and aggressor into account, it would be turned to the status as shown in FIG. 11A. Here, it is arranged in such manner that nets with wide window of signal arrival time and nets with narrow window are locally concentrated and brought together. That is, in regions 1101 and 1103, there are extremely many nets with wide window. In regions 1102 and 1104, there are extremely many nets with narrow window. In such case, it would be difficult to replace the aggressor by changing the wire tracks as shown in FIGS. 10A and 10B. Specifically, a wire track is shown in FIG. 11B, giving enlarged views of regions 1101 and 1103. As shown on the right portion of FIG. 11B, there are only the nets with wide window, and no matter how the wire tracks are allocated, the relationship between relative window and delay degradation amount is turned to unfavorable condition. Now, description will be given on a method to avoid such situation referring to FIG. 11C. This figure is a view of a chip and wire tracks in each region as seen from above and shows that signal arrival time windows of the wire nets arranged there are narrow or wide. According to the method of the present invention, instead of the arrangement as shown in the left portion of FIG. 11C, it is arranged in such manner that nets with wide windows and nets with narrow windows are approximately in equal numbers as shown in the right portion of FIG. 11C (i.e. the nets with wide windows and the nets with narrow windows are present at less than a given ratio in each space). As a result, the wires can be allocated to have favorable condition as shown in the right portion of FIG. 11D. Even when delay time degradation due to crosstalk may occur in a net 2 and a net 3 with wire allotment as shown in the left portion of FIG. 11D, if the net 3 is replaced with a net 5, the relationship between relative window and delay degradation amount can be improved in the right portion of FIG. 11D similarly to the case shown in FIG. 7. In this case, too, there is no need to change the logic gates or to insert delay gate, and crosstalk can be reduced without increasing the designing work.

Further, according to the present invention, delay time degradation can be reduced by allocating wire track to be used by wire nets according to the characteristics of window of signal arrival time. This is shown in FIGS. 12A and 12B. FIG. 12A shows signal arrival time window of the wire nets. In case of a net 1, signal arrival time window is positioned in the first half in the cycle time (e.g. cycle CT of clock signal). In case of a net 2, signal arrival time window is positioned in the second half in the cycle time. Here, these nets are classified into two classes, and class 1 is allocated as window in the first half and class 2 is allocated as window in the second half. When these wire nets are allocated on wire tracks as shown in FIG. 12B, only the wire of class 1 is arranged on an odd-numbered wire track, and only the wire of class 2 is arranged on an even-numbered wire track. Then, the relationship between relative window and delay degradation amount of the wire nets allocated on adjacent wire tracks (on odd-numbered wire track and even-numbered wire track) will be turned to favorable condition. That is, it is not the status as "v" and "a1" in FIG. 7, but it is turned to the status as "v" and "a2", and delay time degradation due to crosstalk is reduced. In this case, too, there is no influence on synthesis step and arrangement step, and it would suffice only to consider locally on the allocation of wire tracks in the wiring step. Thus, there is no need to increase the designing work.

As it is evident from the above description, a wide variety of inventions are disclosed in the present application. These can be summarized as follows:

Specifically, the first invention of the present application provides a method for designing an electronic circuit device, comprising the steps of calculating a possible range of relative signal arrival time from ranges of dynamic signal arrival time in each of a wire in question and a wire adjacent thereto, and calculating delay time degradation between the wire in question and the adjacent wire using an information on delay time degradation due to crosstalk retrievable by the relative signal arrival time, whereby logic gates for driving each of the wire in question or the adjacent wire and at least a part of logic gates located closer to input side than the above logic gates comprise transistor having threshold value different from threshold value of transistor of the other logic gates with the purpose of reducing delay time degradation due to crosstalk as calculated.

The second invention of the present application provides an electronic circuit device to reduce delay time degradation due to crosstalk by arranging in such manner that logic gates for driving each of the wire in question and the wire adjacent thereto and at least a part of logic gates located closer to input side than the above logic gates comprise transistor having threshold value different from threshold value of transistor of the other logic gates.

The third invention of the present application provides a method for designing an electronic circuit device, and the method comprises the steps of calculating a possible range of relative signal arrival time from ranges of dynamic signal arrival time at each of a wire in question and a wire adjacent thereto, calculating delay time degradation between the wire in question and the wire adjacent thereto using an information on delay time degradation due to crosstalk retrievable by the relative signal arrival time, and arranging at least one of the wire in question or the adjacent wire on a wire track having connecting ratio in either of capacitance or inductance of vertical wire layer to lateral wire layer with the purpose of reducing delay time degradation due to crosstalk as calculated.

The fourth invention of the present application provides a method for designing an electronic circuit device, comprising the steps of calculating a range of dynamic signal arrival time in wire nets, each serving input/output of logic gates, when a plurality of logic gates are arranged in distributed plural sections in a plurality of spaces, classifying the ranges of signal arrival time to wire nets and narrow nets based on a given reference, and arranging the logic gates in such manner that wire net ratio for each class of the ranges of signal arrival time will be less than a given ratio in each space, and further performing wiring with the purpose of reducing delay time degradation due to crosstalk.

The fifth invention of the present application provides a method for designing an electronic circuit device, comprising the steps of calculating ranges of dynamic signal arrival time in wire nets, each serving as input/output of logic gates, classifying the ranges of signal arrival time into a plurality of classes as early-arriving nets and delayed-arriving nets, and arranging a net of the class designated in advance among the classes to each wire track of the wire nets for the purpose of reducing delay time degradation due to crosstalk.

The sixth invention of the present application provides an electronic logic circuit device, comprising wire nets classified into a plurality of classes of early-arriving nets and delayed-arriving nets using the range of signal arrival time as a reference, and also comprising a plurality of wire track of the wire nets, whereby the net of the class designated in advance is arranged on the wire track for the purpose of reducing delay time degradation due to crosstalk.

The seventh invention of the present application provides a method for designing an electronic circuit device, comprising the steps of calculating possible range of relative signal arrival time from range of dynamic signal arrival time of each of a wire in question and a wire adjacent thereto in the circuit when designing a semiconductor chip comprising a plurality of signal paths connecting a plurality of electronic circuit blocks incorporated therein or designing an electronic circuit device where the semiconductor chip is provided on a circuit substrate and an electronic circuit is formed, calculating delay time degradation between the wire in question and the adjacent wire using information on delay time degradation due to crosstalk retrievable by the relative signal arrival time, and placing a delay element arranged in distributed manner in advance in the semiconductor chip, a delay element intensively arranged around a circuit block in the semiconductor chip, or a delay element intensively arranged around the semiconductor chip on the substrate to signal paths including the wire in question or the adjacent wire with the purpose of reducing delay time degradation due to crosstalk as calculated.

The eighth invention of the present application provides an electronic logic circuit device, wherein there are provided a first wire layer comprising an electronic logic circuit having relatively lower delay time degradation value and a second wire layer comprising an electronic logic circuit having relatively higher delay time degradation value than the first wire layer, the two wire layers being laminated on a single substrate, a third wire layer being disposed via a first inter-layer insulating film with relatively smaller thickness above or below the second wire layer, and a fourth wire layer being disposed via a second inter-layer insulating film with relatively greater thickness above or below the first wire layer.

BRIEF DESCRIPTION OF THE DRAWINGS

FIG. 5 represents characteristic diagrams to explain a principle of crosstalk reduction method according to the present invention;

FIG. 6 shows characteristic diagrams to explain another principle of crosstalk reduction method according to the present invention;

FIG. 7 shows characteristic diagrams to explain still another principle of crosstalk reduction method according to the present invention;

FIGS. 8A, 8B and 8C represents a circuit diagram and wire patterns respectively to explain an embodiment of the present invention;

DETAILED DESCRIPTION OF THE PREFERRED EMBODIMENTS

Figure 1:
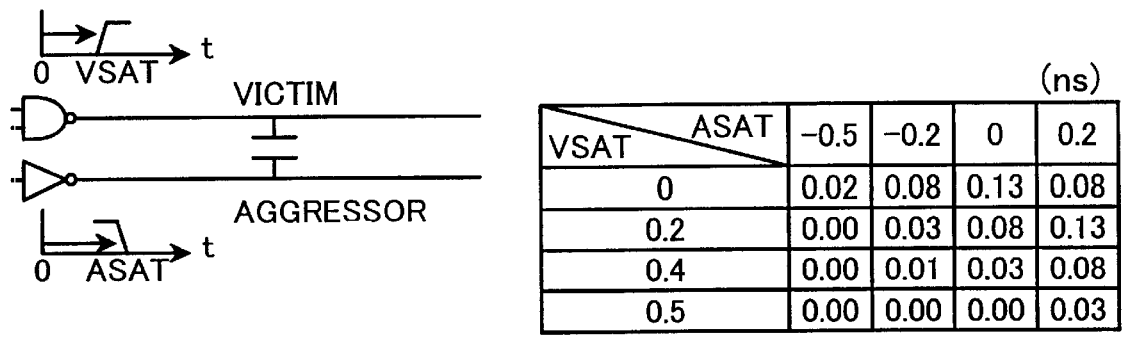
FIG. 1 represents a circuit diagram and a table of characteristics showing a circuit to explain delay degradation, which varies according to combination of signal arrival time in two types of wires.
Figure 2:
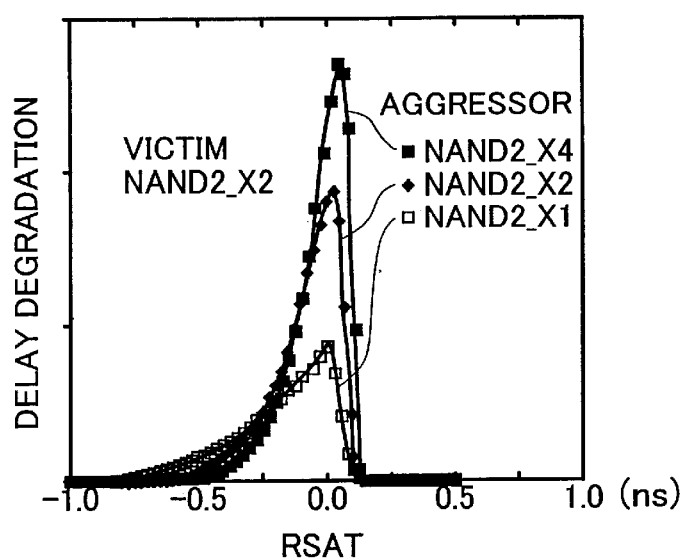
FIG. 2 represents a characteristic diagram to explain changes of delay degradation value according to relative signal arrival time (RSAT)
Figure 3:
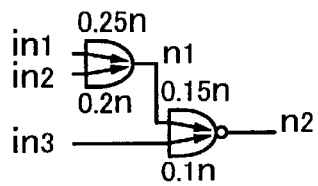
FIG. 3 represents a circuit diagram and a table of characteristics showing a circuit to explain change of signal arrival time depending on input pattern (signal path)
Figure 4A:
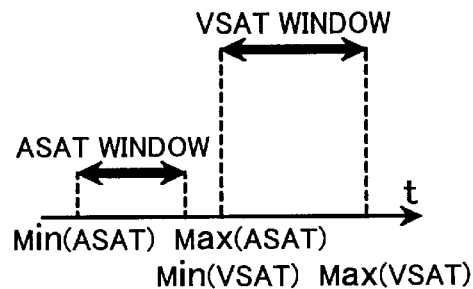
FIGS. 4A, 4B and 4C each represents a characteristic diagram to explain a method for calculating delay time degradation by giving consideration on signal arrival time depending on the changes of input patterns (changes of signal paths)
Figure 4B:
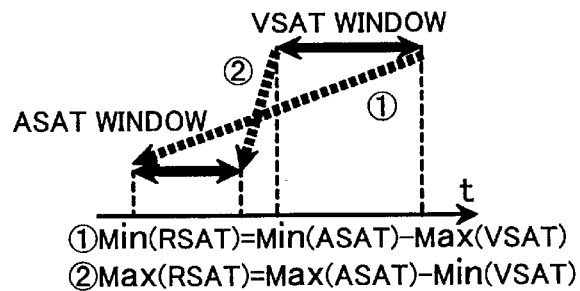
Figure 4C:
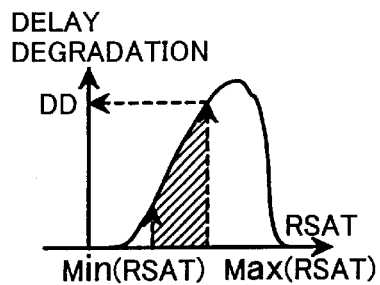
Figure 9A:
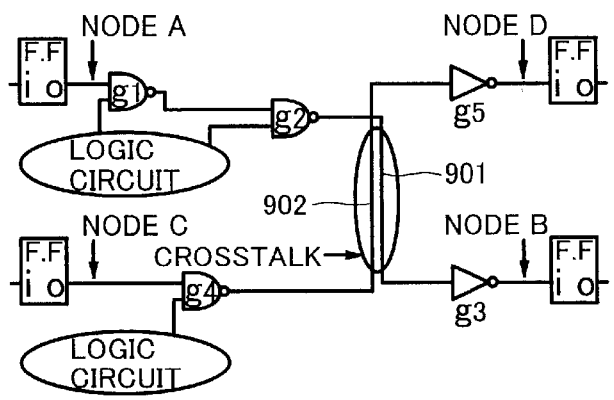
FIGS. 9A, 9B, 9C and 9D represent a circuit diagram and wire patterns respectively to explain another embodiment of the present invention.
Figure 9B:
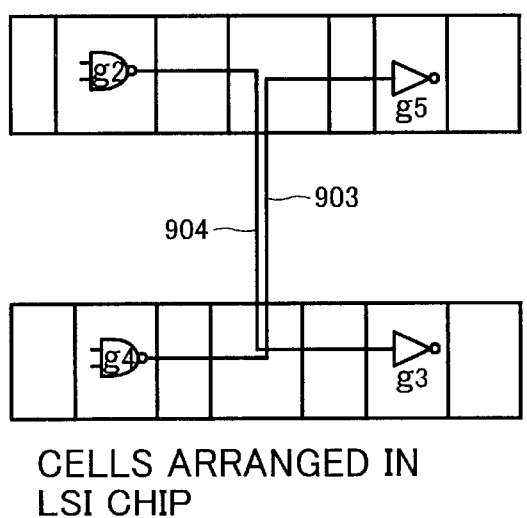
Figure 9C:
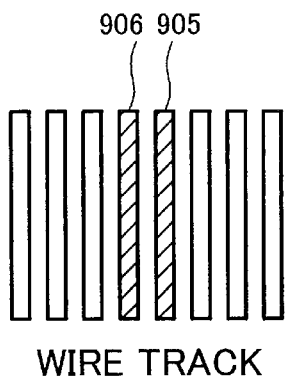
Figure 9D:
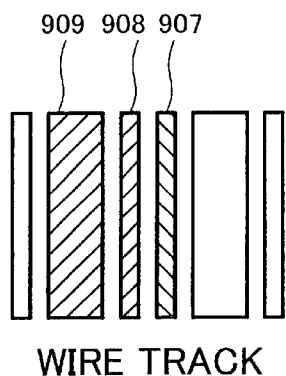
Figure 10A:
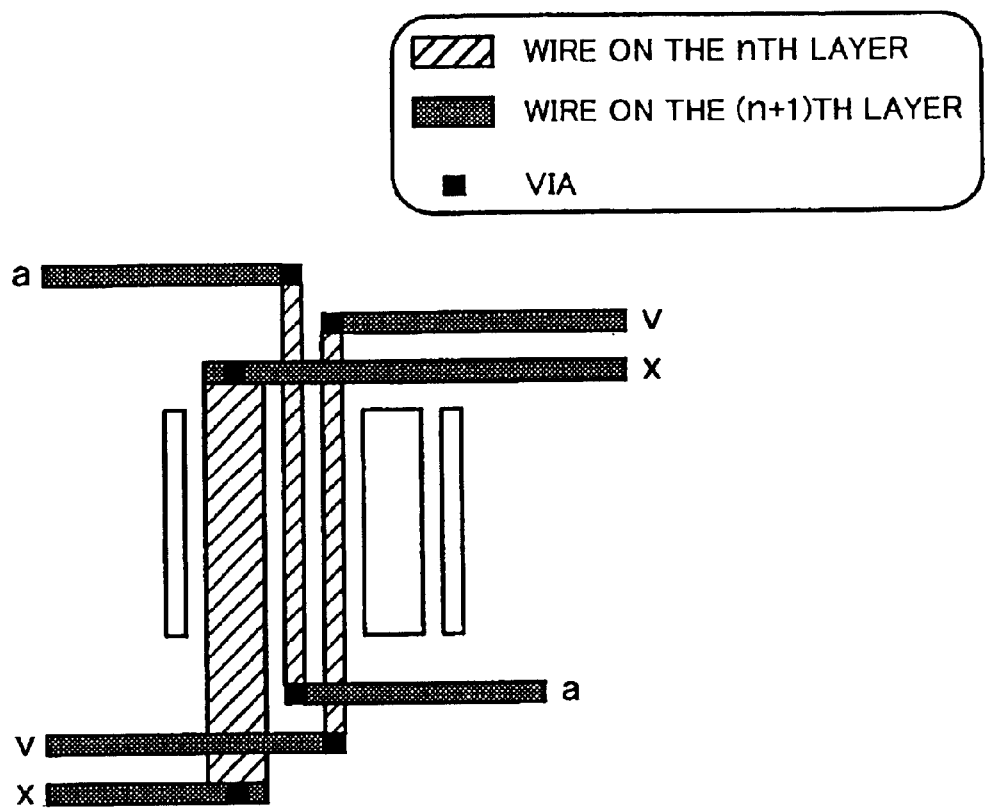
FIGS. 10A and 10B each represents a wire pattern to explain another embodiment of the present invention.
Figure 10B:
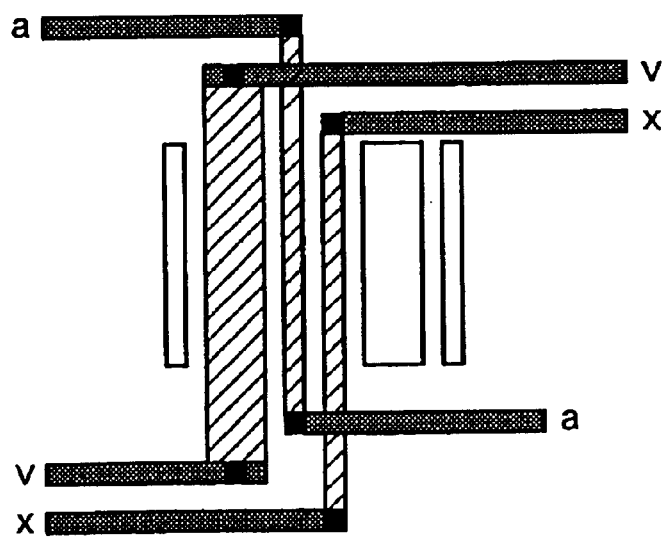
Figure 11A:
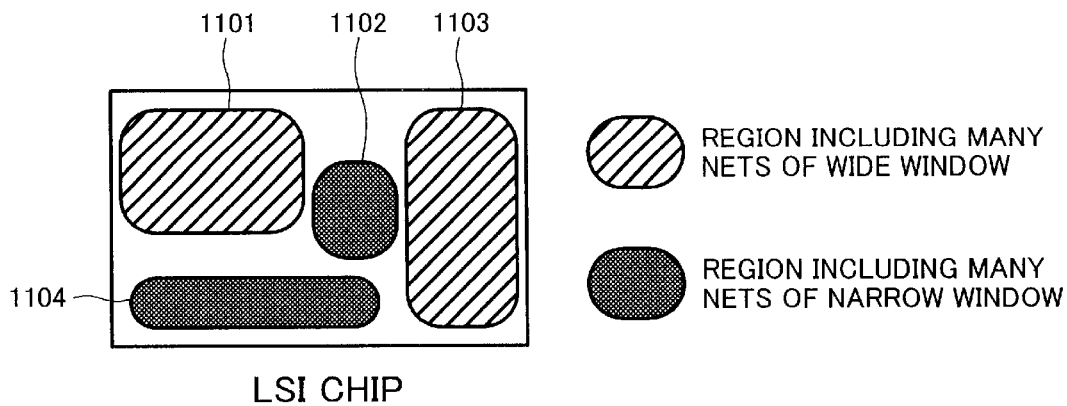
FIGS. 11A, 11B, 11C and 11D represent wire patterns and delay degradation characteristic diagrams respectively to explain another embodiment of the present invention.
Figure 11B:
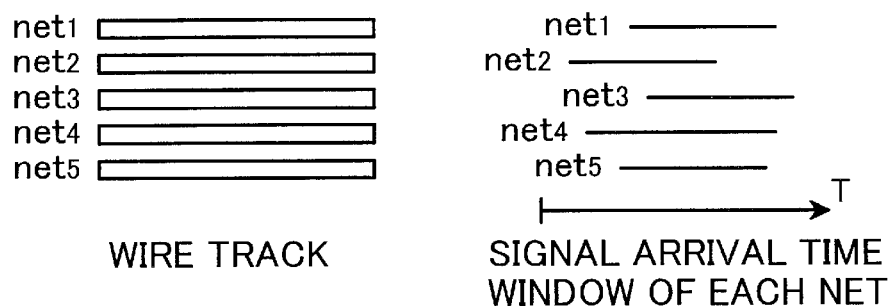
Figure 11C:
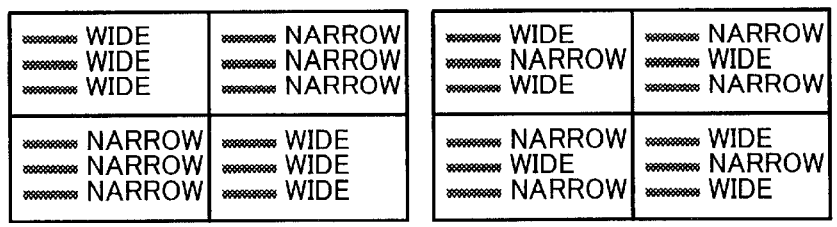
Figure 11D:
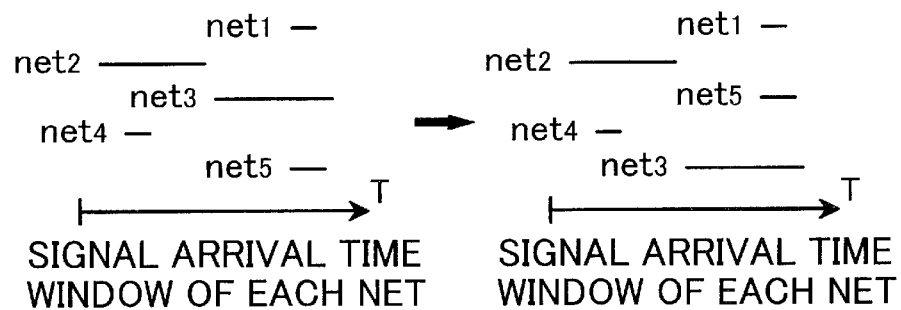

Description will be given below on embodiments of the present invention referring to the drawings.

Figure 13:
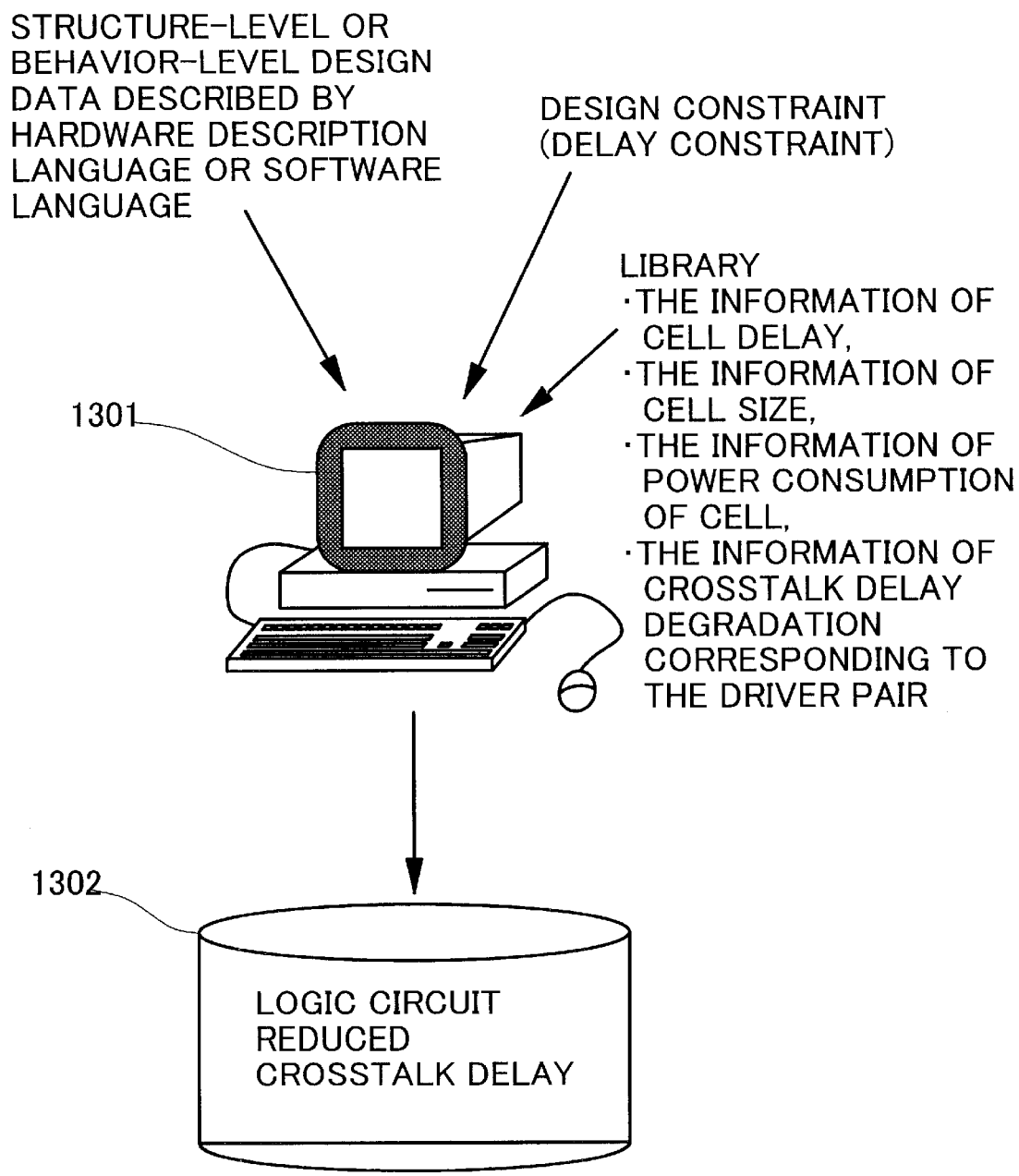
FIG. 13 is a drawing of a design system to explain a design method according to the present invention.

The design method according to the present invention can be achieved by using an automatic design system (1301 in FIG. 13), which comprises an arithmetic unit, a storage unit, and a man-machine interface. Specifically, a designer inputs system description of structural level or operation level described in hardware design language or software language. At the same time, design constraint including delay time is given to the system. Also, together with library information of cell library group including delay time of logic gate, a library relating to delay time degradation retrievable by relative signal arrival time is provided.

Figure 14:
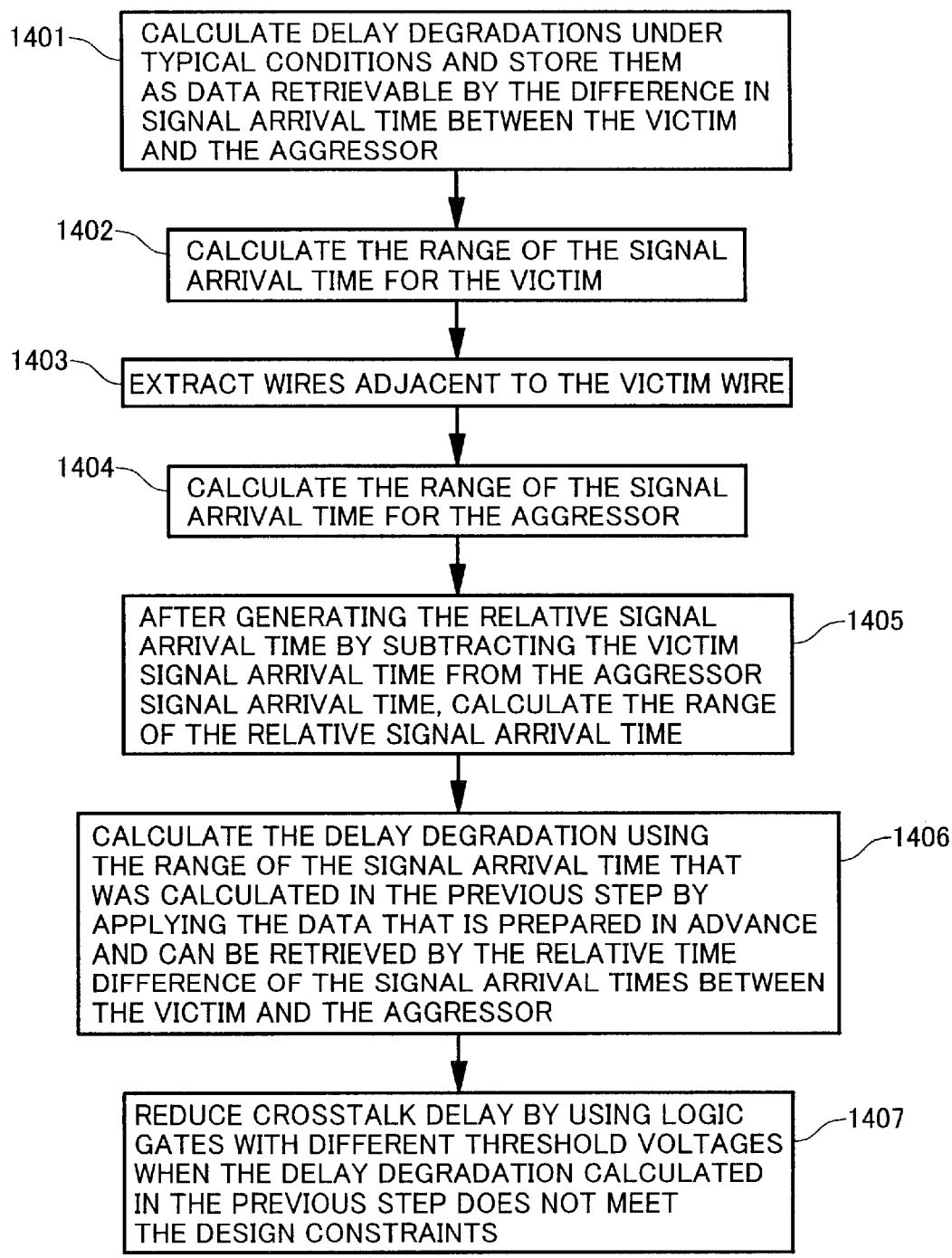
FIG. 14 is a design flow chart to explain a design method of the present invention.

This design system generates physical information of a circuit on LSI or printed circuit board via steps such as logic synthesis, arrangement, and wiring as already described in relation to the subject matter. By performing a series of processing as shown in FIG. 14 as a design method described in the first invention of the present application as described above after these design procedures have been completed, it is possible to avoid violation of the constraint by crosstalk without repeating the steps of synthesis, arrangement and wiring already carried out.

Specifically, as explained in connection with FIG. 14, delay time degradation value due to crosstalk under typical condition is calculated, and the result is stored as a data format retrievable by relative time difference of signal arrival time on a node in question and an adjacent node (1401). Next, the range of signal arrival time at the node in question is calculated (1402). Then, the wire belonging to the node in question and the adjacent wire are extracted (1403). Further, the range of signal arrival time at the adjacent node is calculated (1404). Then, the signal arrival time at the adjacent node is converted to a relative signal arrival time using the signal arrival time at the node in question as a reference, and a possible range of the relative signal arrival time is calculated (1405). Next, an amount of delay degradation is calculated from the range of signal arrival time as calculated in the preceding step, using a data format retrievable by relative time difference of the signal arrival time between the node in question and the adjacent node (1406). Then, in case the amount of delay degradation calculated in the preceding step does not meet the design constraint, crosstalk is reduced by a logic gate with a transistor having different threshold value (1407).

Figure 15:
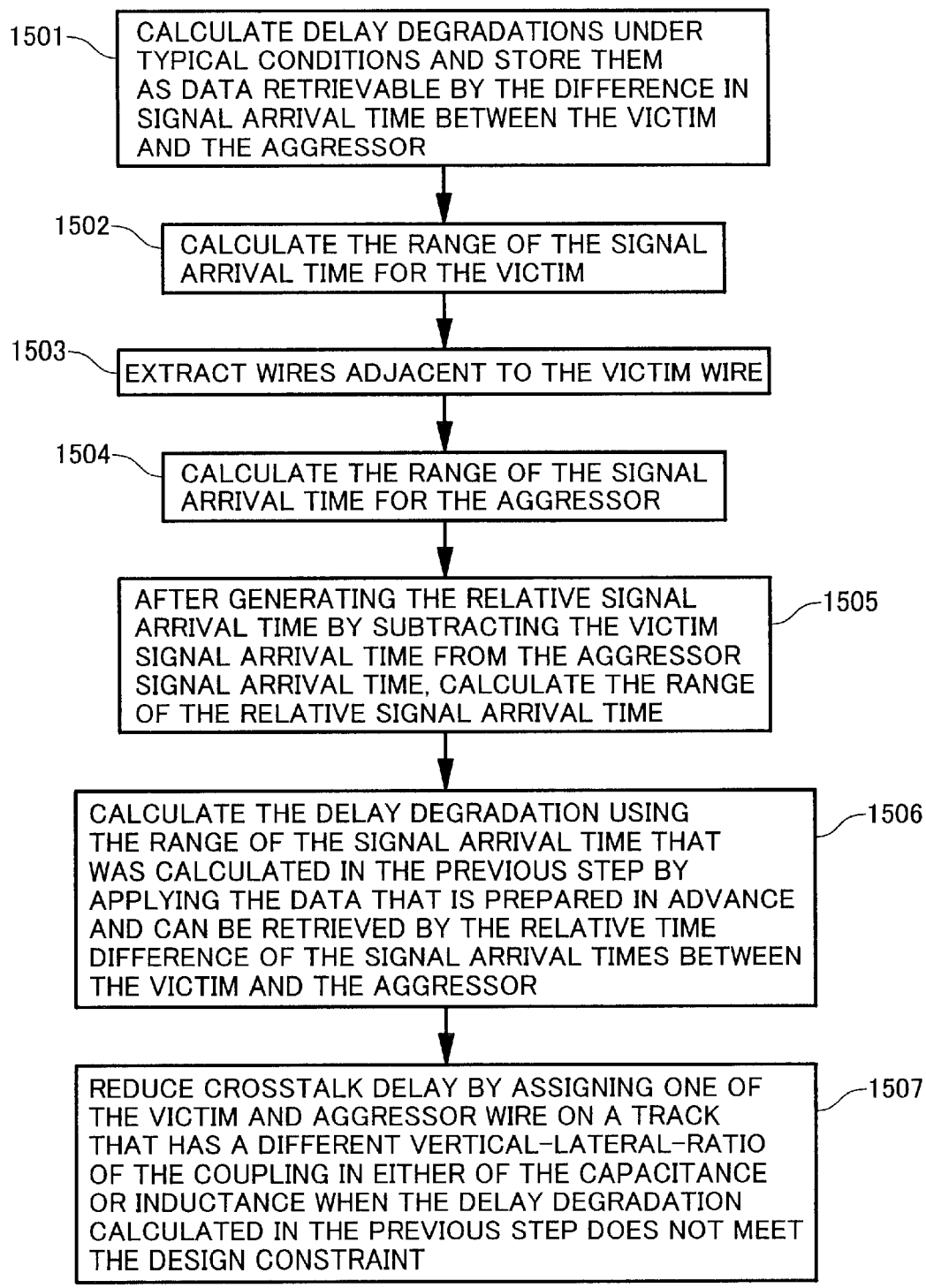
FIG. 15 is a design flow chart to explain another design method of the present invention.

Similarly, physical information of circuit on LSI or printed circuit board is generated via steps such as logic synthesis, arrangement and wiring. After these design procedures have been completed, by performing a series of processing as shown in FIG. 15 as a design method described in the third invention of the present application as described above, it is possible to avoid violation of the constraint by crosstalk without repeating the steps of synthesis and arrangement as already carried out.

Specifically, as explained in connection with FIG. 15, delay time degradation value due to crosstalk under typical condition is calculated, and this is stored as a data format retrievable by relative time difference of signal arrival time between the node in question and the adjacent node (1501). Next, the range of the signal arrival time at the node in question is calculated (1502). Further, the wire belonging to the node in question and the adjacent node are extracted (1503). Then, the range of signal arrival time at the adjacent node is calculated (1504). Further, the signal arrival time at the adjacent node is converted to a relative signal arrival time using the signal arrival time of the node in question as a reference, and a possible range of the relative signal arrival time is calculated (1505). Next, an amount of delay degradation is calculated from the range of signal arrival time calculated in the preceding step using the data format retrievable by relative time difference of signal arrival time between the node in question and the adjacent node (1506). Then, in case the delay degradation amount calculated in the preceding step does not meet the design constraint, crosstalk is reduced by placing at least one of the wire in question and the adjacent wire on a wire track having different vertical/lateral connecting ratio in either of capacitance or inductance (1507).

Figure 16:
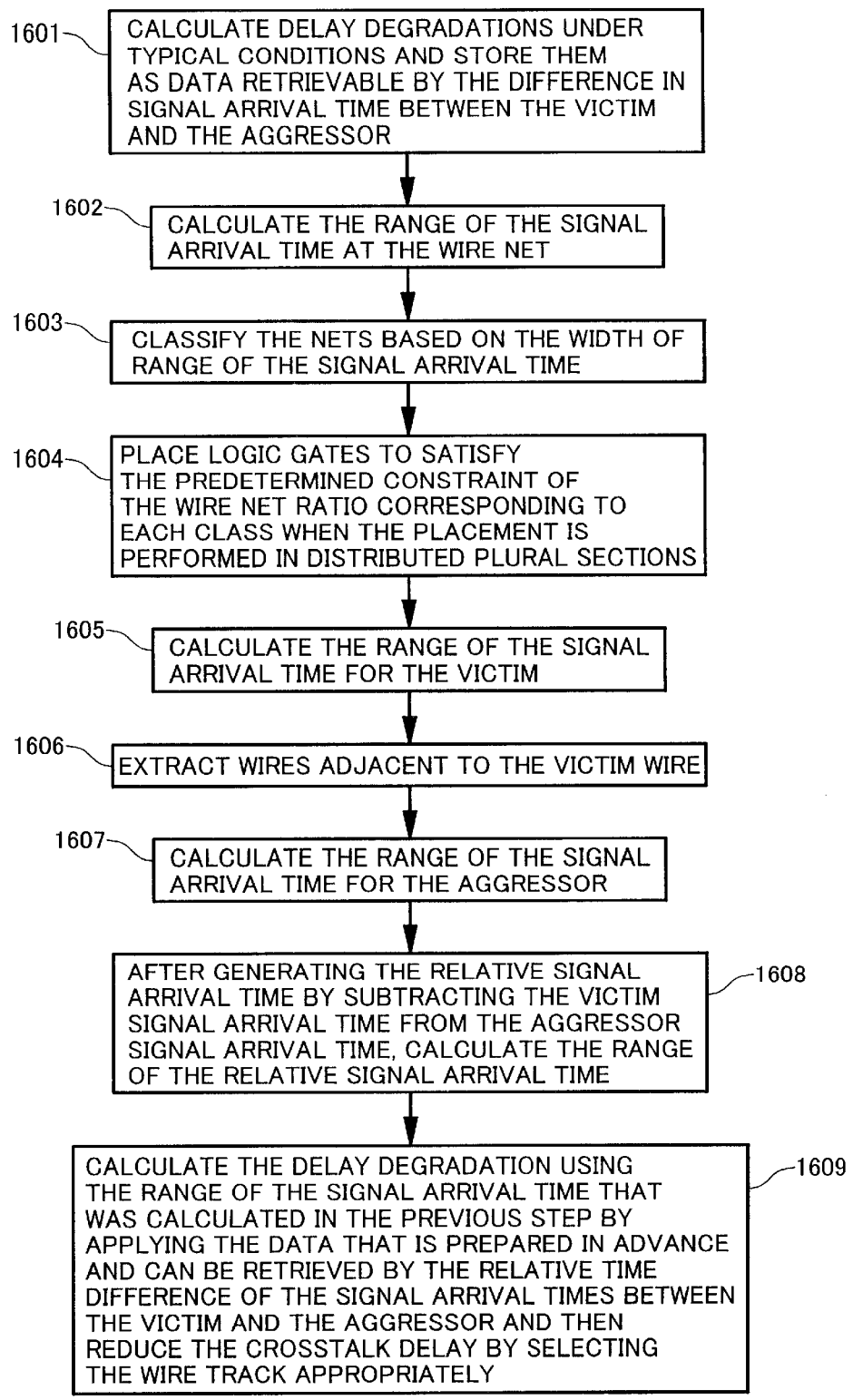
FIG. 16 is a design flow chart to explain still another design method of the present invention.

Further, in the design system as described above, by carrying out a series of processing as shown in FIG. 16 when wiring is performed after distributed arrangement of logic gates as in the design method described in the fourth invention of the present application, it is possible to allocate wire tracks to avoid crosstalk in the subsequent wiring steps. In this case, too, it is possible to reduce crosstalk delay time degradation without repeating the steps of arrangement and wiring.

Specifically, as explained in connection with FIG. 16, delay time degradation value due to crosstalk under typical condition is calculated, and this is stored as a data format retrievable by relative time difference of signal arrival time between the node in question and the adjacent node (1601). Then, the range of signal arrival time at wire net is calculated (1602). Next, wire nets are classified according to the extent of the range of the signal arrival time (1603). Then, it is arranged in such manner that the ratio of the number of wire nets of each class in each region is to be lower than a predetermined reference value when the logic gates are arranged in distributed plural sections in a plurality of regions (1604). Further, the range of signal arrival time at the node in question is calculated (1605). Then, the wire belonging to the node in question and the adjacent wire are extracted (1606). Next, the range of signal arrival time at the adjacent node is calculated (1607). Then, the signal arrival time at the adjacent node is converted to relative signal arrival time using the signal arrival time of the node in question as a reference, and a possible range of relative arrival time is calculated (1608). Further, using the data format retrievable by relative time difference of the signal arrival time between the node in question and the adjacent node as stored previously, an amount of delay degradation is calculated from the range of signal arrival time calculated in the preceding step. Crosstalk is reduced by selecting wire track so that the amount of delay degradation is reduced (1609).

Figure 17:
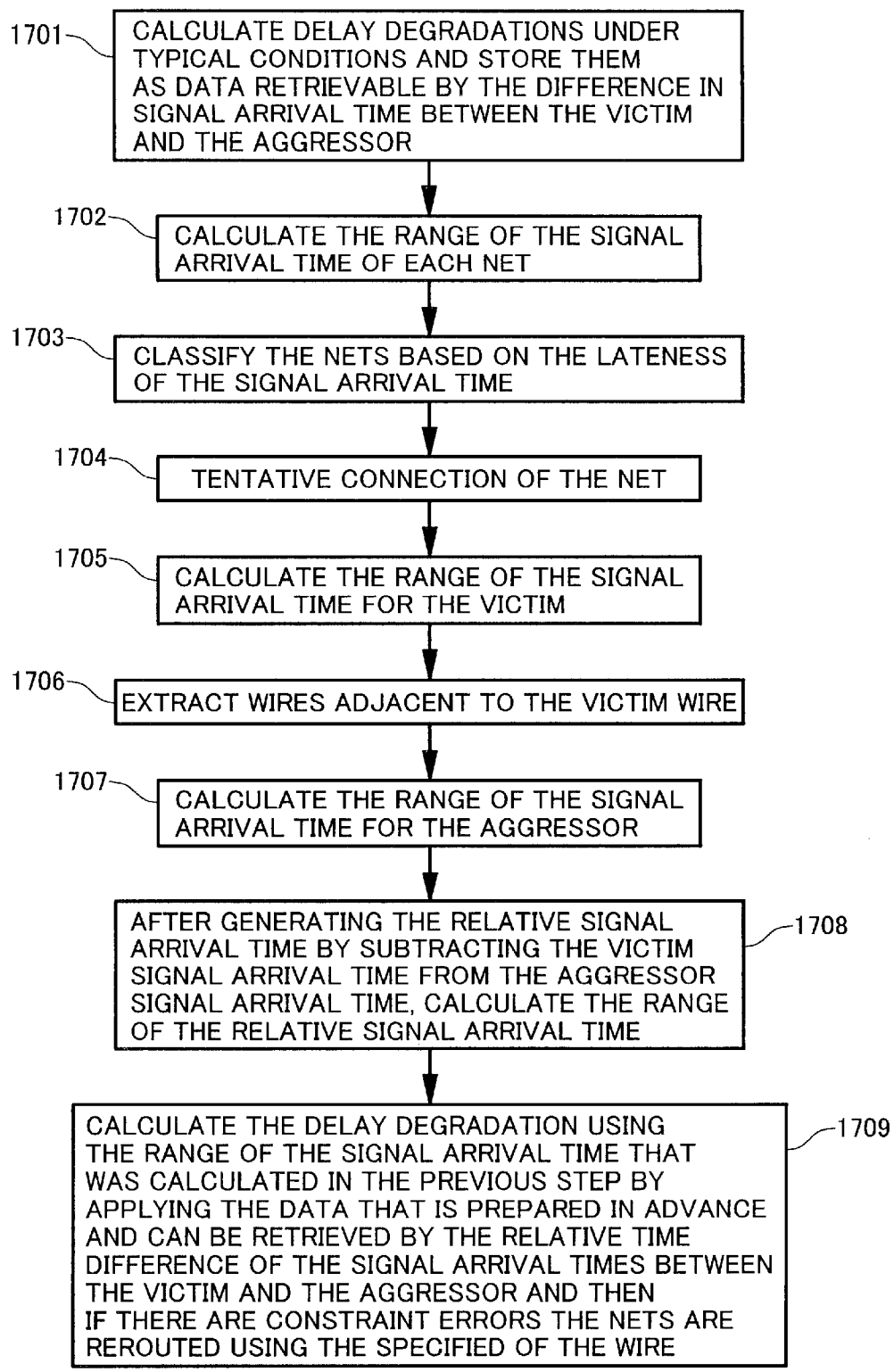
FIG. 17 is a design flow chart to explain another design method of the present invention.

Similarly, as in the design method described in the fifth invention of the present application as described above, by carrying out a series of processing as shown in FIG. 17 when wiring step is performed, it is possible to allocate wire tracks to avoid crosstalk. In this case, too, it is possible to reduce delay time degradation due to crosstalk without repeating the steps of synthesis and arrangement.

Specifically, as explained in connection with FIG. 17, delay time degradation value due to crosstalk under typical condition is calculated first, and this is stored as a data format retrievable by relative time difference of signal arrival time of the node in question and the adjacent node (1701). Next, the range of signal arrival time at each wire net is calculated (1702). Then, the wire nets are classified according to whether the range of the signal arrival time is earlier or delayed (1703). Further, provisional connection of the wire nets is performed (1704). Next, the range of signal arrival time at the node in question is calculated (1705). Then, the wire belonging to the node in question and the adjacent wire are extracted (1706). Further, the range of signal arrival time at the adjacent node is calculated (1707). Next, the signal arrival time of the adjacent node is converted to relative signal arrival time using the signal arrival time of the node in question as a reference, and a possible range of relative signal arrival time is calculated (1708). Then, using the data format retrievable by relative time difference of signal arrival time of the node in question and the adjacent node as stored previously, an amount of delay degradation is calculated from the range of the signal arrival time calculated in the preceding step. In case there is violation of the constraint, using the wire track determined in advance according to the class, the wire nets are connected again, and crosstalk is reduced (1709).

It is needless to say that, in FIGS. 14, 15, 16 and 17, the steps designated by 1401, 1501, 1601 and 1701 may be executed in advance and may be stored in form of crosstalk library.

Figure 18A:
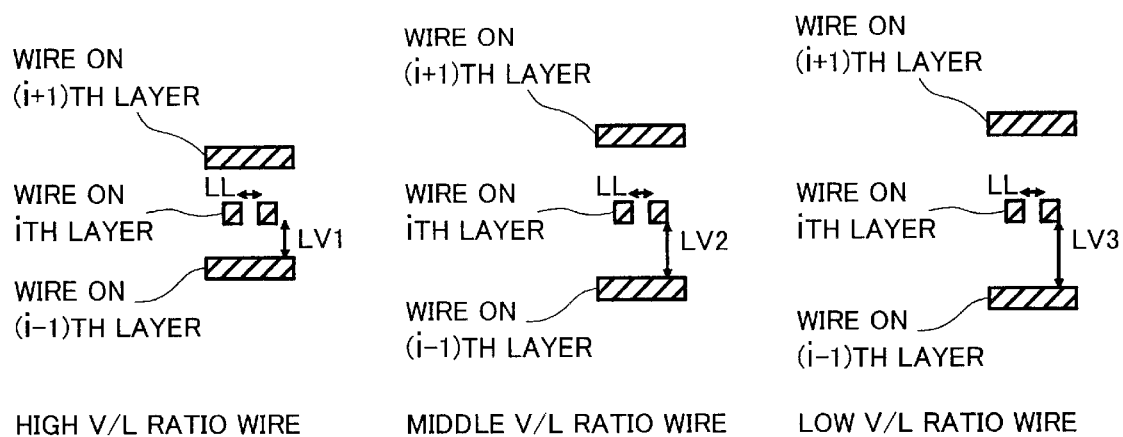
FIGS. 18A and 18B each represents a drawing of essential portion of wire to explain an embodiment of the present invention.
Figure 18B:
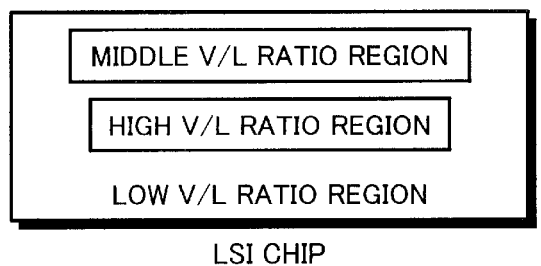

FIGS. 18A and 18B each represents another embodiment of the third invention of the present application as described above. Specifically, FIG. 18A is a cross-sectional view of essential portions of wires, which plainly explains the status where wires in odd-number layer and wires in even-number layer are running in direction crossing perpendicularly to each other. Here, in order to change vertical/lateral connecting ratio (V/L ratio) of capacitance or inductance of vertical (i.e. in direction toward wire depth) wire layer and lateral wire layer, a distance from the wire on i-th layer to the wire on (i−1)-th layer and (i+1)-th layer is changed. That is, as shown in FIG. 18A, the thickness of insulating film between different layers is changed as LV1, LV2, and LV3 with respect to inter-wire distance LL (e.g. uniform distance) of the layers on the same level. In so doing, vertical connecting ratio is decreased in the order of LV1/LL, LV2/LL and LV3/LL. As a result, the ratio of the distance between the vertical wire layer and the lateral wire layer is changed, and this makes it possible to change vertical/lateral connecting ratio (hereinafter referred as "V/L ratio"). The portion of the wire layer, which is calculated as having relatively higher delay time degradation value (as calculated from the possible range of relative signal arrival time) is set in a region with high V/L ratio in FIG. 18B. A portion, which is expected to have medium value of delay time degradation, should be set in a region with medium V/L ratio. A portion as calculated to have relatively lower delay time degradation value should be set in a region with low V/L ratio. Because such V/L ratio is determined by thickness of the insulating film between layers, this can be achieved by designating Max. Therefore, it may be performed after the steps of synthesis, arrangement and wiring have been completed. Because there is no need to re-design, it can be achieved without increasing the designing work. FIG. 18B is a top view of an essential portion of a wire on a semiconductor chip or a substrate.

Figure 19A:
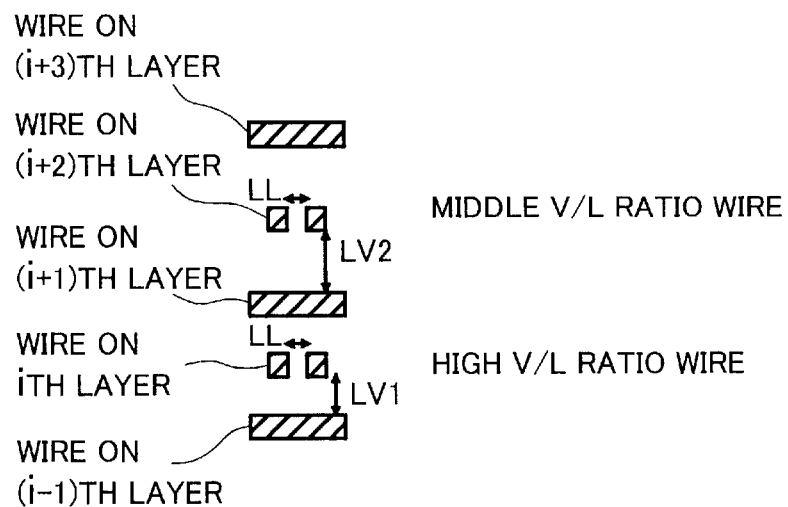
FIGS. 19A and 19B each represents a drawing of an essential portion of wire to explain another embodiment of the present invention.
Figure 19B:
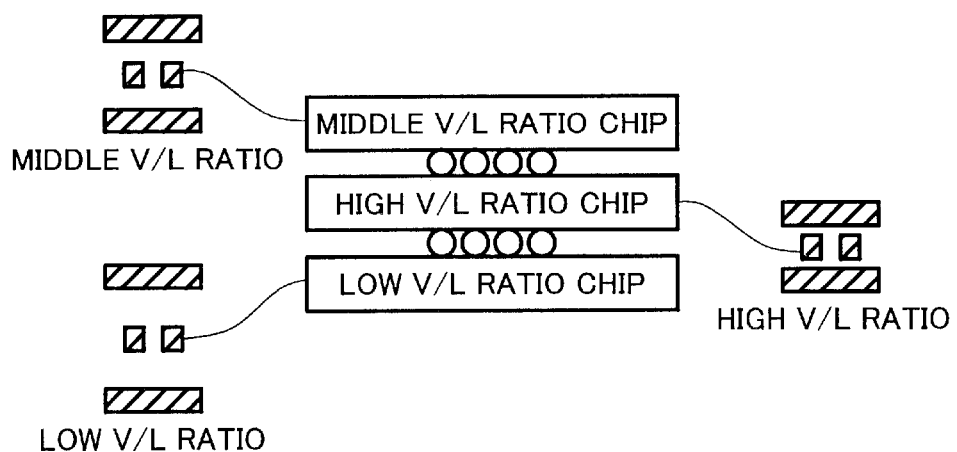

Further, FIGS. 19A and 19B each represents another embodiment using the third invention of the present application as described above. In FIG. 18A as explained above, connecting ratio (V/L ratio) of vertical wire layer to lateral wire layer is changed at each point as seen from the above of the chip (See FIG. 18B). Such change can be performed in direction toward depth when the chip is seen from above. This is shown in FIG. 19A, which is a cross-sectional view of a plurality of wire layers.

In FIG. 19A, it is set in such manner that a distance from the wire on i-th layer to the wire on (i−1)-th layer or on (i+1)-th layer is shorter than a distance from the wire on (i+2) layer to the wire on (i+1)-th layer or on (i+3)-th layer. As a result, the wire on i-th layer has higher V/L ratio than the wire on (i+2)-th layer. Therefore, on the wire layer, which is calculated as having relatively higher delay time degradation value as calculated from the possible range of relative signal arrival time, allotment should be made to a layer with high V/L ratio such as i-th layer. Also, the wire layer, which is calculated as having relatively lower delay time degradation value, should be allocated to a layer with low V/L ratio such as (i+2)-th layer. In this case, there may be influence on the wiring step, but it may be overcome by local change. Further, there is no influence on the step of synthesis or arrangement, and the increase of designing work can be avoided. This also applies to the eighth invention of the present application as described above.

In this connection, it is preferable that delay time degradation value of various wire portions to RSAT is calculated and each wire and electronic circuit are classified according to the value of delay time degradation, and that the level of wire layer is allocated for each class. Specifically, it is preferable that all of the wires having relatively higher delay time degradation value should be provided to the wire on i-th layer as shown in FIG. 19A to reduce crosstalk in relatively lateral direction, and that all of the wires with relatively lower delay time degradation value should be provided to the wire on (i+2)-th layer. That is, it is preferable that, as it is evident from FIG. 19A, wires on (i−1)-th layer or on (i+1)-th layer are arranged above or below the wire layer (i-th layer) with relatively higher delay time degradation value via an inter-layer insulating film with relatively smaller thickness, and that the wires on (i+1)-th layer or on (i+3)-th layer are laminated on a given substrate above or below the wire layer ((i+2)-th layer) with relatively lower delay time degradation value via an inter-layer insulating film with relatively greater thickness to provide an electronic circuit device.

Compared with the case where a number of wires having different delay time degradation values are provided on the wire layers of a common level, when the delay time degradation values are classified within a given range and wire levels are allocated according to each class, there is no need to provide inter-layer insulating film, and this contributes to the increase of design efficiency and to the improvement of reliability in electronic circuit device.

As another example of the case where V/L ratio is changed in vertical direction with respect to the plane of the chip, there is a case where a plurality of chips are provided on a single substrate to constitute a system of electronic circuit device. As shown in FIG. 19B, V/L ratio is changed for each chip and a portion, which is calculated as having higher delay time degradation value is allocated to the chip with high V/L ratio, and the portion calculated as having lower delay time degradation value should be allocated to a chip with low L/V ratio.

Figure 20:
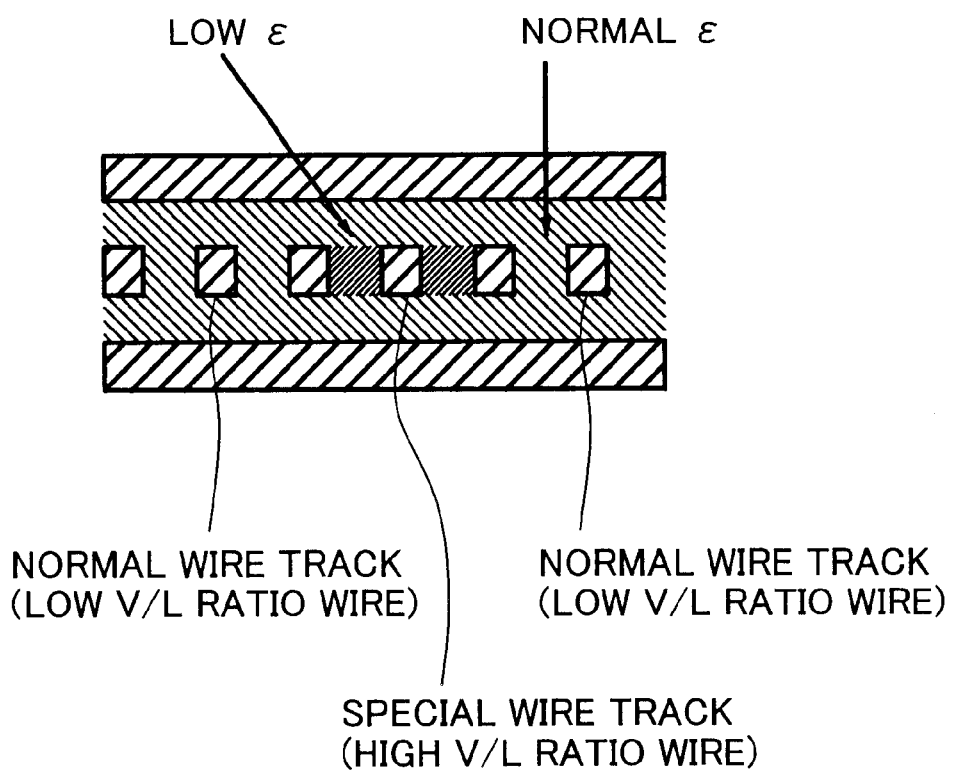
FIG. 20 is a drawing of an essential portion of wire to explain another embodiment of the present invention.

FIG. 20 shows another embodiment using the third invention of the present application as described above. To change the connecting ratio of vertical wire layer to lateral wire layer, dielectric constant ∈ of the inter-layer film in lateral direction is changed according to each point. For instance, a material having lower dielectric constant ∈ such as organic polyimide film has lower strength. If this is performed for the entire device, the reliability of wire strength of the chip may be decreased. However, if $SiO_2$ film is used in wider extent and organic polyimide film is used only for a limited part, there will be no problem of reliability in the strength of the wire in the chip, and the wire with high V/L ratio and the wire with low V/L ratio can be used together. Using the wires with different connecting ratios, it is possible to reduce the delay time degradation due to crosstalk, and this is the same as explained in connection with FIGS. 18A, 18B and 19A.

Figure 12A:
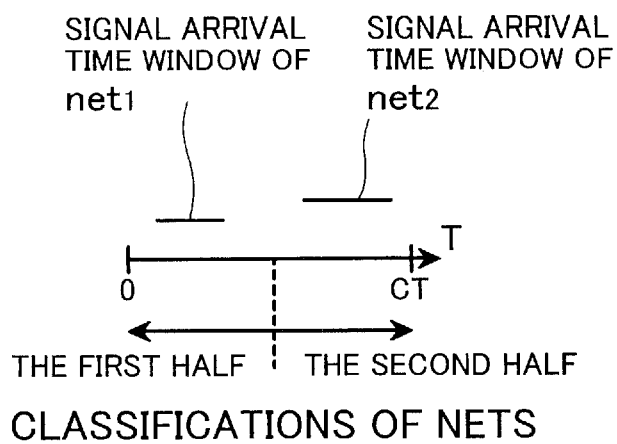
FIGS. 12A and 12B represent a wire track and a delay degradation characteristics diagram respectively to explain another embodiment of the present invention.
Figure 12B:
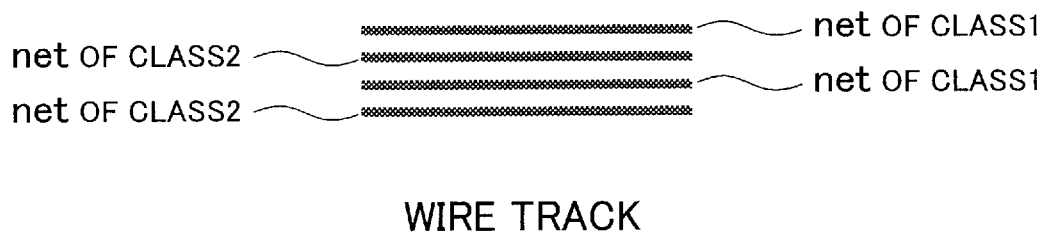
Figure 21A:
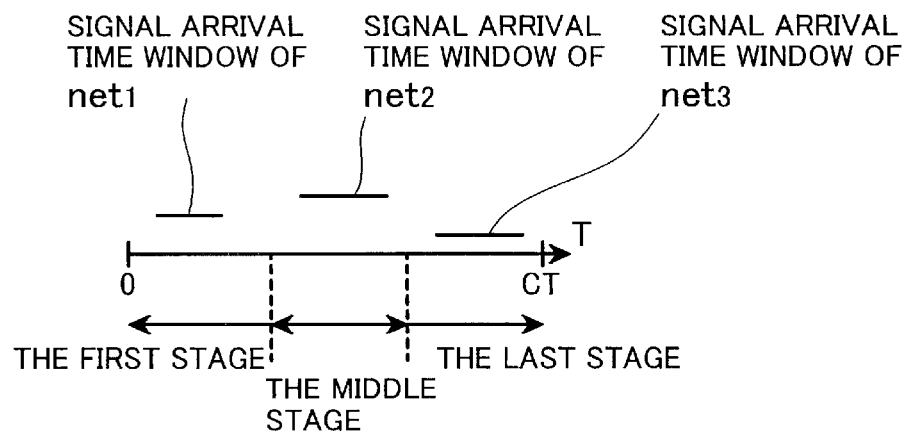
FIGS. 21A and 21B are drawings to show delay degradation characteristics and essential portions of wires respectively to explain another embodiment of the present invention.
Figure 21B:
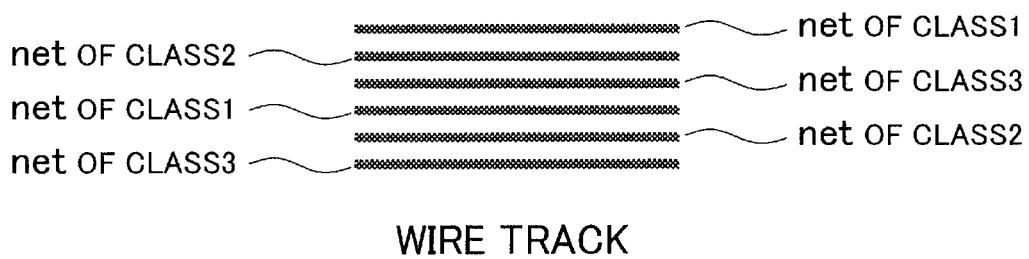

FIGS. 21A and 21B each represents another embodiment using the fifth invention of the present application as described above. In FIGS. 12A and 12B, wire nets are classified into two classes depending upon whether the window of signal arrival time is earlier or delayed and wire tracks are allocated. In the examples shown in FIGS. 21A and 21B, there are 3 classes in such classification. Classification is made to class 1, class 2, and class 3 according to the position of window of wire nets with respect to cycle time. FIG. 21B shows the case where wire nets are allocated in such manner that the wires of class 1 to class 3 are aligned on the wire tracks one after another. In so doing, it is possible to prevent the wire nets with similar timing of window (earlier or delayed) from coming closer to each other and it is possible to perform more elaborate control in the allocation of wire tracks.

Figure 22A:
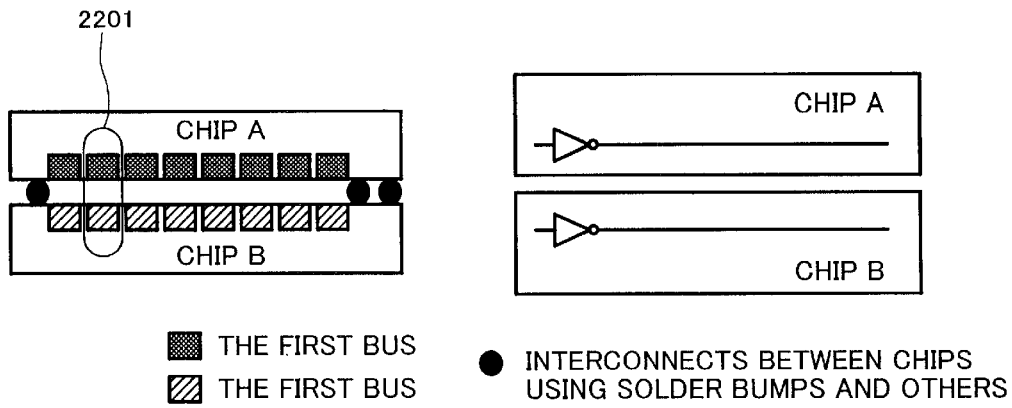
FIGS. 22A, 22B and 22C represent an essential portion of wire and delay degradation characteristics respectively to explain another embodiment of the present invention.
Figure 22B:
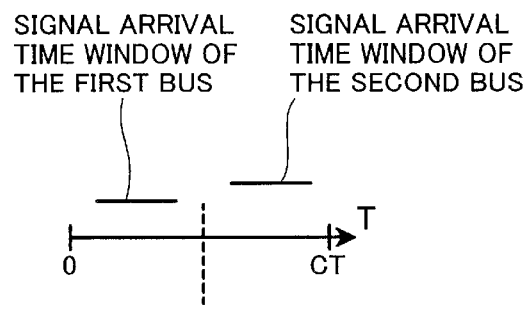
Figure 22C:
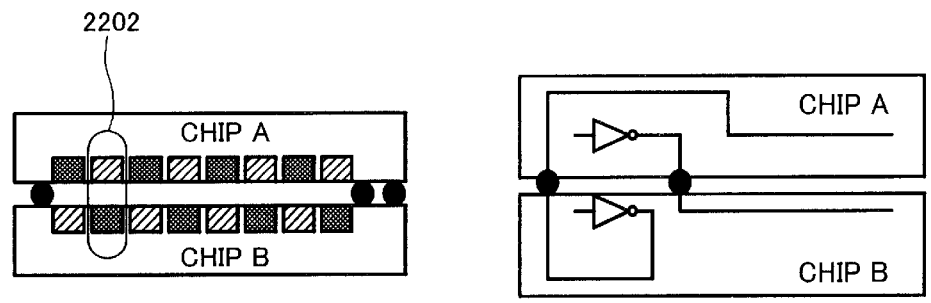

Further, FIGS. 22A to 22C each represents another embodiment using the fifth invention of the present application. In these examples, the classification according to whether window of signal arrival time is earlier or delayed is carried out to two buses on different chips. For instance, as shown in FIG. 22A, there is a first series of buses on the chip A, and there is a second series of buses on the chip B. A view as seen from advancing direction of each bus wire is given on left side, and a view of the portion of 2201 as seen from lateral direction to the advancing direction is given on right side. Here, it is assumed that these two series of buses are operated at different timing. Specifically, these buses are operated at different timing as shown in FIG. 22B, for instance (in this case, at the timing of the first half and the second half of cycle as in the example of FIG. 12A). In the case shown in FIG. 22A, the wires operated at the same timing are located closer to each other, and delay time degradation due to crosstalk occurs. To avoid this, if bus wire of each series is provided in such manner that they cross each other as shown in FIG. 22C, the wires of class 1 and class 2 are located adjacent to each other as in the case of FIG. 12B, and this makes it possible to prevent delay time degradation due to crosstalk. In this case, too, there is no influence on the steps of synthesis and arrangement in the design of each chip, and this contributes to the prevention of the increase of designing work.

Figure 23A:
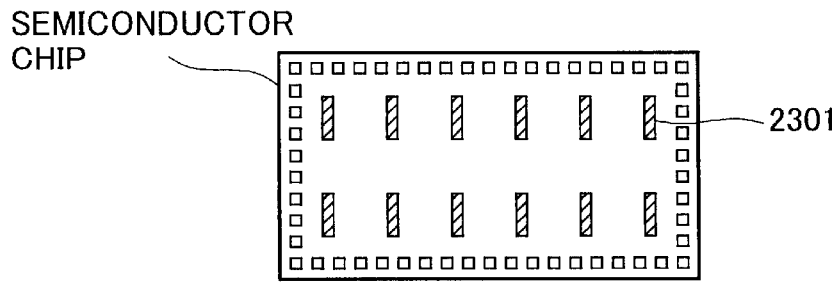
FIGS. 23A, 23B and 23C each represents an essential portion of wire to explain another embodiment of the present invention.
Figure 23B:
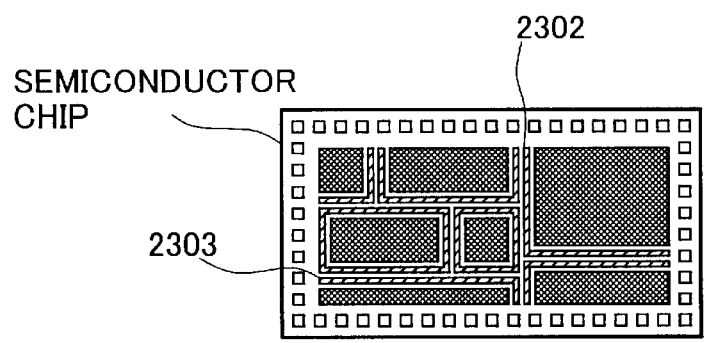
Figure 23C:
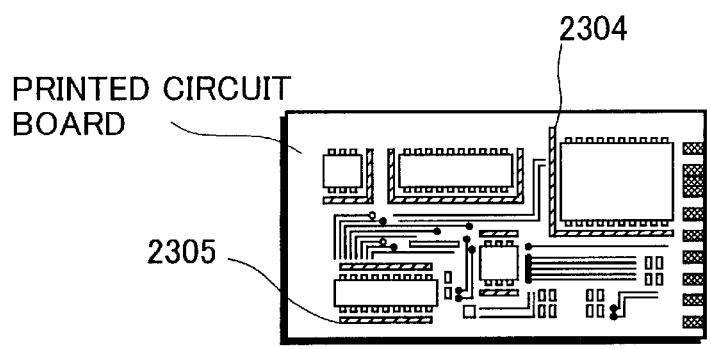

FIGS. 23A to 23C each represents a design method using the seventh invention of the present application. Specifically, when a delay element is inserted in a signal path on adjacent wire side, the delay time degradation due to crosstalk can be reduced in the manner as shown in FIG. 5. With the purpose of achieving this without repeating the steps of synthesis and arrangement, a delay element is provided in advance on semiconductor chip or on printed circuit board. FIG. 23A shows the case where delay elements (2301) are placed in advance uniformly on a chip. On the other hand, FIG. 23B shows the case where delay elements (2302 and 2303) are intensively positioned around each of design blocks (or IP). The reasons for this are as follows: Wires connecting design blocks very often run for relatively longer distance. In case of wiring, which runs for long distance, crosstalk occurs as the result of parallel running for longer distance, and this also leads to higher delay time degradation. The above method is effective in overcoming such problem. This also applies to the case of FIG. 23C where a system is constructed on a printed circuit board. In general, a printed circuit board has higher physical dimensions compared with a semiconductor chip, and this often leads to the case where connection between elements runs for longer distance. For this reason, crosstalk occurs from longer parallel running distance, and delay time degradation also tends to be higher. Therefore, to solve these problems, delay elements (2304 and 2305) are intensively arranged around the elements such as semiconductor chips. In this case, the expression "around" the elements in case of the system on printed circuit board may not necessarily mean "around outer side" of the element, but it maybe on peripheral portion inside the element. For instance, a delay mechanism may be provided within an I/O buffer. FIGS. 23A to 23C each represents a plan view of an essential portion of chip or substrate.

Figure 24:
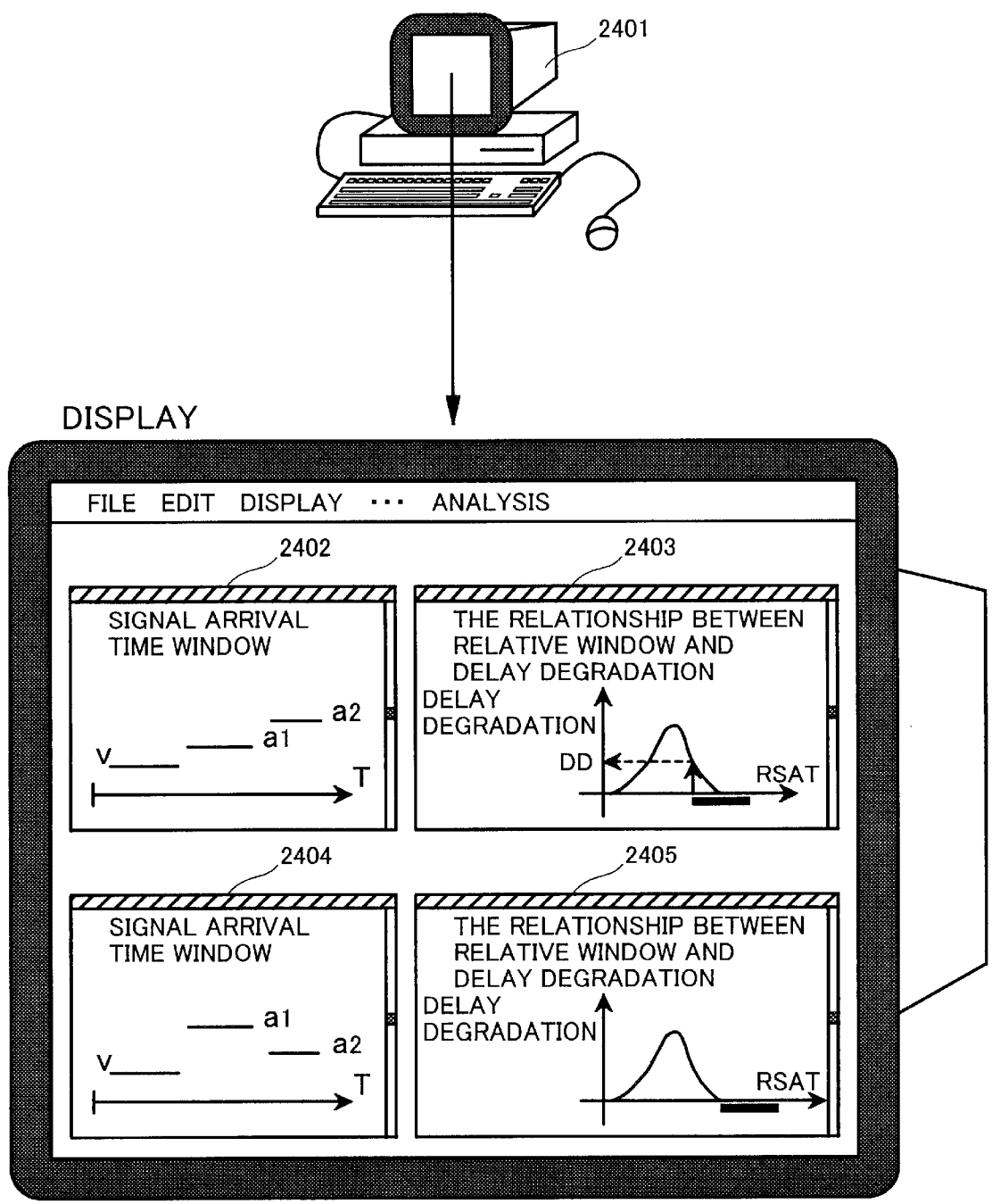
FIG. 24 is a drawing to explain a display screen of a design system for executing the design method of the present invention.

FIG. 24 shows a display screen of a design system using various examples of the present invention as described above. The process to reduce delay time degradation due to crosstalk as shown in FIG. 5 to FIG. 7 can be confirmed on the screen of the design system. A designer first watches pictures of 2402 and 2403 on the screen in FIG. 24 and confirms that there is delay time degradation due to crosstalk. Then, actions are taken based on the methods of the present invention as described in the above, and it is then confirmed that the problem of delay time degradation has been overcome as in 2404 and 2405. When design system possesses such display screen, the designer can quickly identify the problem due to cross talk and can also confirm the result of the actions taken.

According to the present invention, it is possible to achieve a high-performance integrated circuit or a system on substrate with lower delay time degradation due to crosstalk even in case where signal arrival time of the wire in question or the adjacent wire is dynamically changed according to the input patterns.

What is claimed is:

1. A method for designing an electronic circuit device, comprising the steps of:

calculating a possible range of relative signal arrival time from a range of dynamic signal arrival time in each of a wire in question and an adjacent wire to the wire in question of the electronic circuit device;

calculating delay time degradation of the wire in question using the possible range of relative signal arrival time and information on crosstalk delay time degradation of the wire in question due to crosstalk between the wire in question and the adjacent wire; and redesigning the electronic circuit device to reduce the delay time degradation given by the possible range of relative signal arrival time using the information on crosstalk delay time degradation of the wire in question, when the delay time degradation of the wire in question fails to meet a design constraint of the electronic circuit device.

2. The method for designing the electronic circuit device according to claim 1, wherein the electronic circuit device includes at least one logic gate for driving the adjacent wire, said logic gate has a first transistor with a first threshold voltage, and the redesigning step involves replacing the first transistor with a second transistor with a second threshold voltage which is higher than the first threshold voltage.

3. The method for designing the electronic circuit device according to claim 1, wherein the redesigning step involves widening a width of the wire in question while maintaining a width of the adjacent wire.

4. The method for designing the electronic circuit device according to claim 1, wherein, when a plurality of logic gates are arranged in distributed plural sections in a plurality of spaces, after ranges of dynamic signal arrival time in wire nets serving as input/output units of these logic gates have been calculated, these ranges of signal arrival time are classified into a plurality of classes as wide net and narrow net by referring to a given reference, and the logic gates are arranged in such manner that wire net ratio for each class of signal arrival time is turned to lower than a given ratio with the purpose of reducing delay time degradation due to crosstalk.

5. The method for designing the electronic circuit device according to claim 1, wherein, after the ranges of dynamic signal arrival time in wire nets, serving as input/output units of logic gates, have been calculated, these ranges of signal arrival time are classified into a plurality of classes as early-arriving net and delayed-arriving net, and a net of the class designed in advance among the above classes is connected to each wire track of the above wire nets with the purpose of reducing delay time degradation due to crosstalk.

6. The method for designing the electronic circuit device according to claim 1, wherein the electronic circuit device includes a first logic gate to drive the wire in question and a second logic gate to drive the adjacent wire, wherein in the step of redesigning, a threshold voltage of at least one transistor of at least one of the first logic gate and the second logic gate is changed in order to meet the design constraint.

7. The method for designing the electronic circuit device according to claim 1, wherein the electronic circuit device includes a first wire track having a first coupling rate in capacitance with a wire track adjacent to the first wire track and a second wire track having a second coupling rate in capacitance with a wire track adjacent to the second wire track, wherein at least one of the wire in question and the adjacent wire uses the first wire track before the redesigning step, and wherein the redesigning step involves changing at least one of the wire in question and the adjacent wire to the second wire track in order to meet the design constraint.

8. The method for designing the electronic circuit device according to claim 7, wherein the first wire track and the wire track adjacent to the first wire track are arranged in a lateral direction or a vertical direction, and the second wire track and the wire track adjacent to the second wire track are arranged in a lateral direction or a vertical direction.

9. The method for designing the electronic circuit device according to claim 1, wherein the electronic circuit device includes a first wire track having a first coupling rate in inductance with a wire track adjacent to the first wire track and a second wire track having a second coupling rate in capacitance with a wire track adjacent to the second wire track, wherein at least one of the wire in question and the adjacent wire uses the first wire track before the redesigning step, and wherein the redesigning step involves changing at least one of the wire in question and the adjacent wire to the second wire track in order to meet the design constraint.

10. The method for designing the electronic circuit device according to claim 9, wherein the first wire track and the wire track adjacent to the first wire track are arranged in a lateral direction or a vertical direction, and the second wire track and the wire track adjacent to the second wire track are arranged in a lateral direction or a vertical direction.

* * * * *